(12) United States Patent
Purkayastha et al.

(10) Patent No.: US 10,394,706 B2
(45) Date of Patent: Aug. 27, 2019

(54) NON-VOLATILE STORAGE WITH ADAPTIVE COMMAND PREDICTION

(71) Applicant: WESTERN DIGITAL TECHNOLOGIES, INC., San Jose, CA (US)

(72) Inventors: Saugata Das Purkayastha, Bangalore (IN); Revanasiddaiah Prabhuswamy Mathada, Bangalore (IN)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 36 days.

(21) Appl. No.: 15/802,257

(22) Filed: Nov. 2, 2017

(65) Prior Publication Data
US 2019/0129834 A1 May 2, 2019

(51) Int. Cl.
*G06F 12/02* (2006.01)
*G06F 12/0862* (2016.01)
*H01L 27/11556* (2017.01)
*G06N 20/00* (2019.01)

(52) U.S. Cl.
CPC ...... *G06F 12/0215* (2013.01); *G06F 12/0246* (2013.01); *G06F 12/0862* (2013.01); *G06N 20/00* (2019.01); *H01L 27/11556* (2013.01)

(58) Field of Classification Search
CPC .... G06F 3/0679; G06F 3/0611; G06F 3/0659; G06F 9/30043; G06F 12/0875; G06F 12/0862; G06F 9/383; G06F 12/0246; G06N 20/00; H01L 27/11556
USPC .......................................................... 711/137
See application file for complete search history.

(56) References Cited

U.S. PATENT DOCUMENTS

| | | | |
|---|---|---|---|
| 2006/0047914 A1* | 3/2006 | Hofmann | G06F 9/383 711/137 |
| 2008/0183903 A1* | 7/2008 | VanStee | G06F 13/161 710/5 |
| 2008/0276066 A1* | 11/2008 | Lee | G06F 12/1027 711/204 |
| 2011/0296081 A1* | 12/2011 | Hsu | G06F 9/3455 711/103 |
| 2016/0011964 A1* | 1/2016 | Rostoker | G06F 3/06 711/103 |
| 2016/0162185 A1* | 6/2016 | D'Abreu | G06F 11/076 711/103 |

* cited by examiner

*Primary Examiner* — Hashem Farrokh
(74) *Attorney, Agent, or Firm* — Vierra Magen Marcus LLP

(57) ABSTRACT

A non-volatile storage apparatus includes a set of non-volatile memory cells and one or more control circuits in communication with the set of non-volatile memory cells. The one or more control circuits are configured to receive a plurality of non-sequential memory access commands directed to the set of non-volatile memory cells, predict a predicted memory access command based on the plurality of non-sequential memory access commands, and access the set of non-volatile memory cells according to the predicted memory access command.

20 Claims, 19 Drawing Sheets

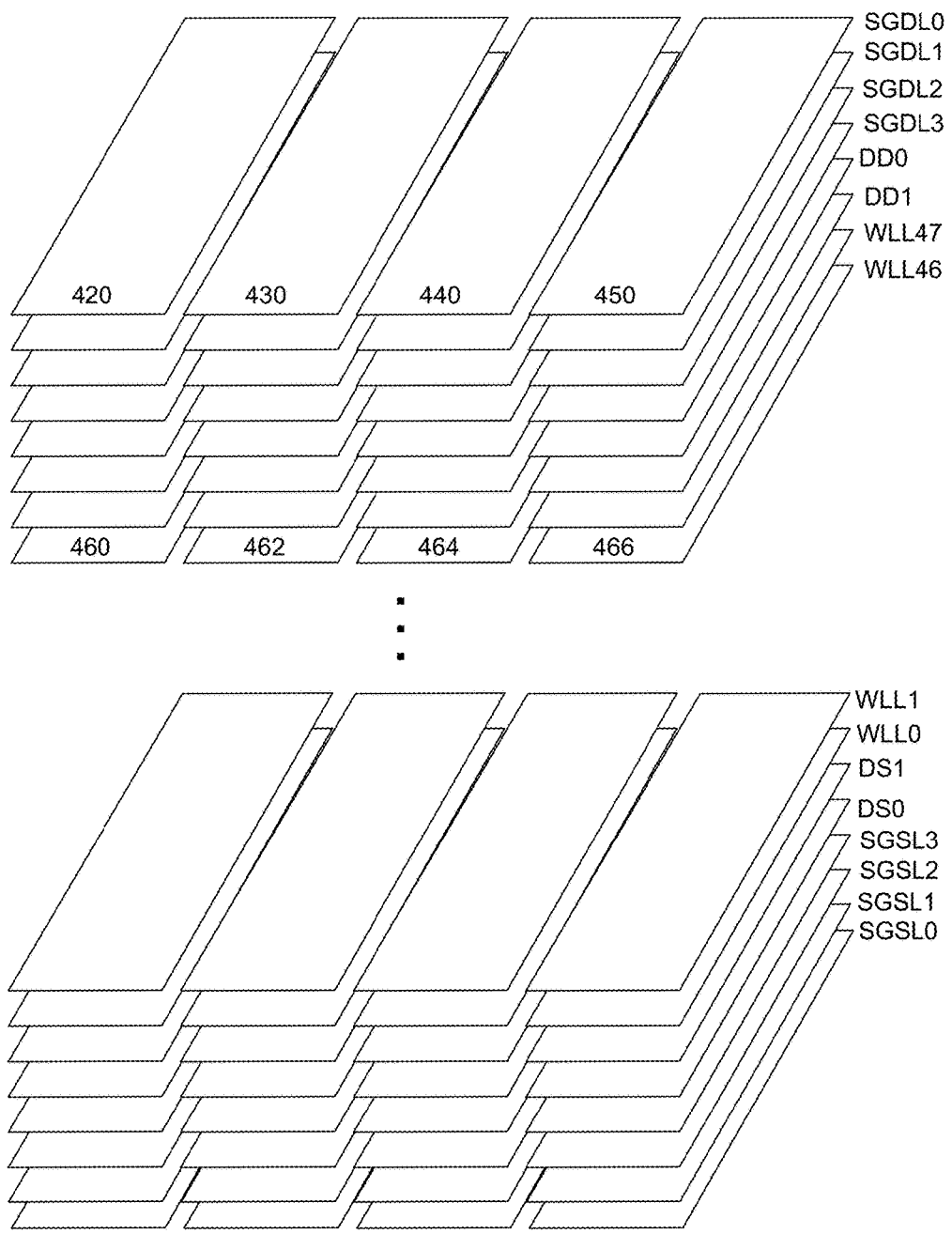

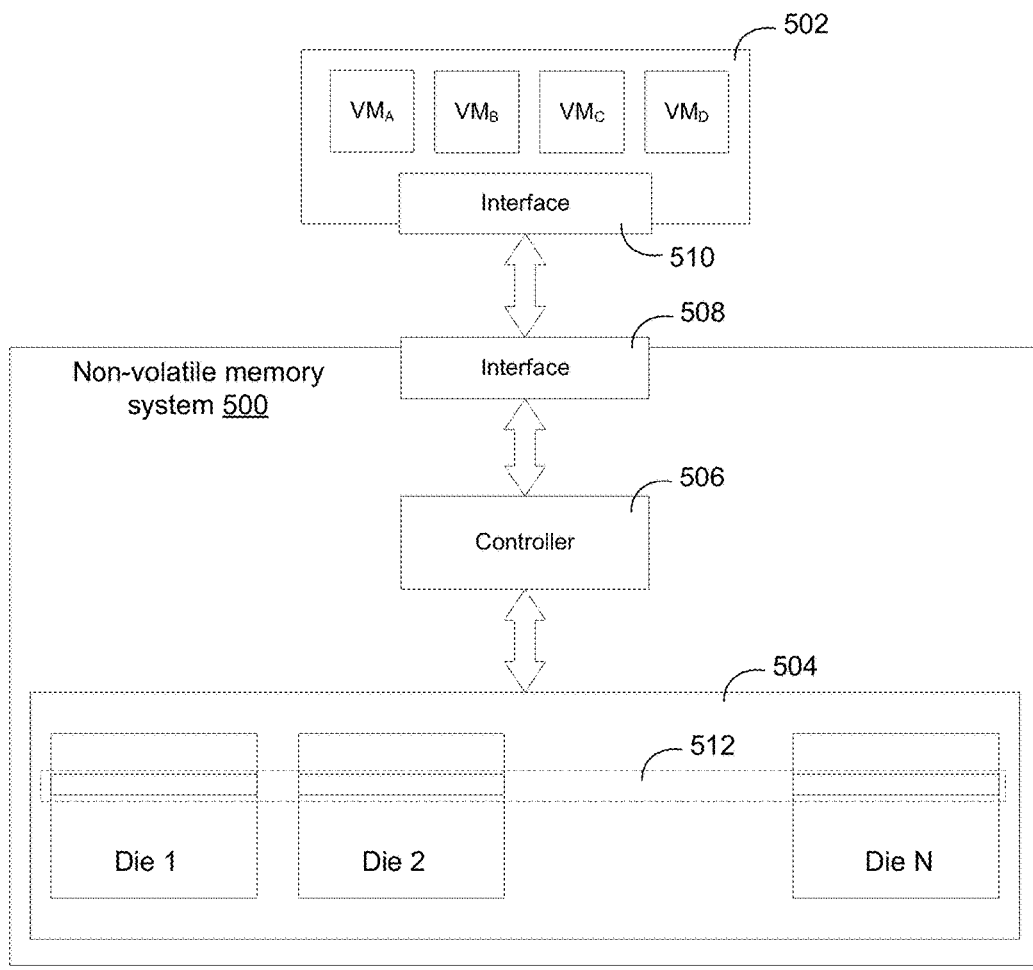

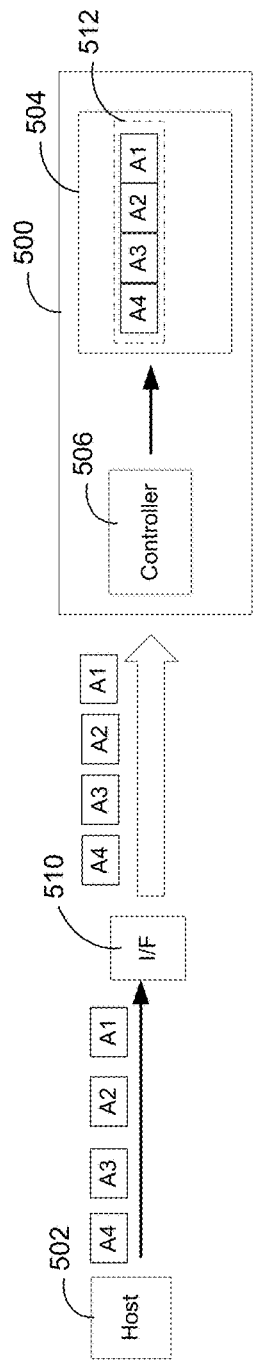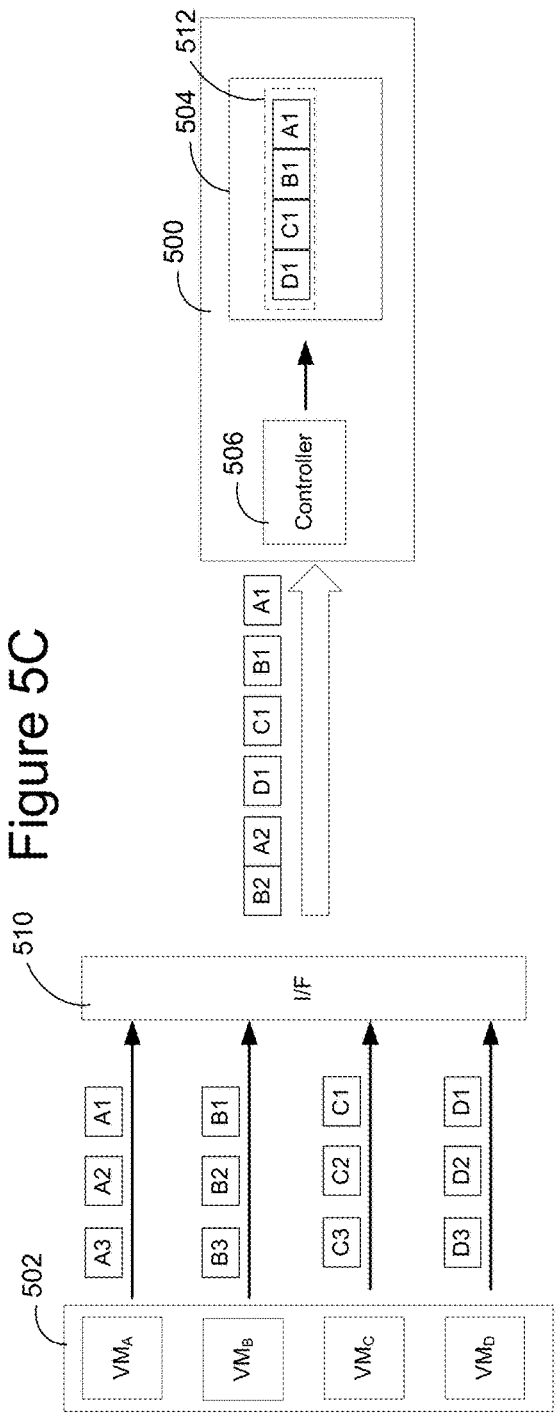

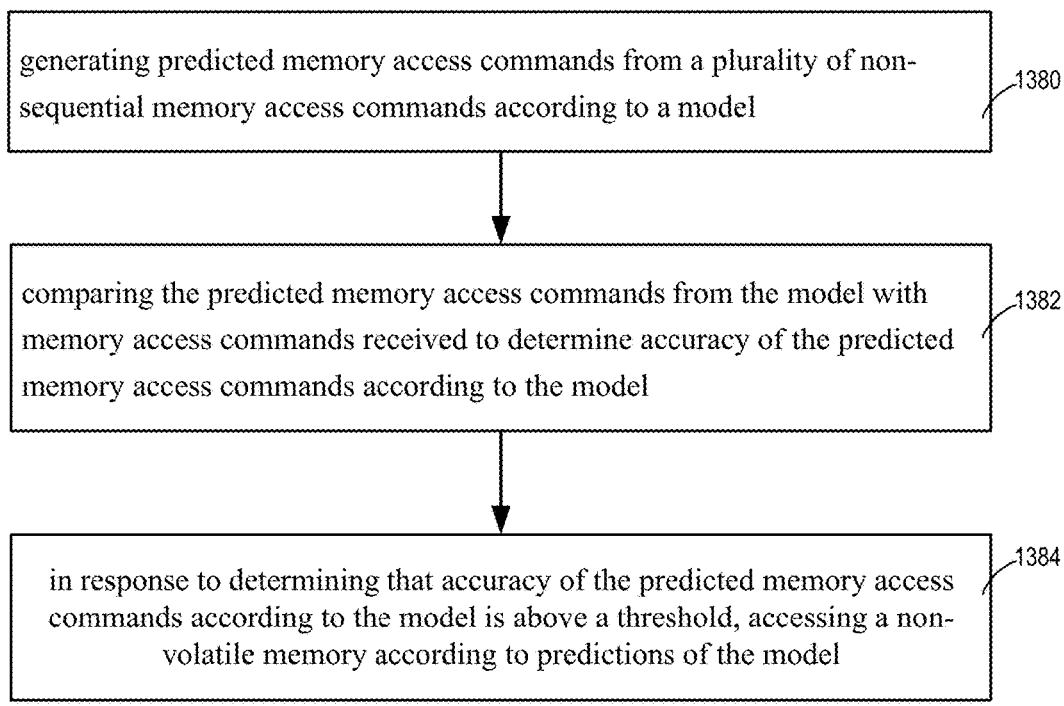

NON-VOLATILE STORAGE WITH ADAPTIVE COMMAND PREDICTION

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

A charge-trapping material can be used in non-volatile memory devices to store a charge which represents a data state. The charge-trapping material can be arranged vertically in a three-dimensional (3D) stacked memory structure. One example of a 3D memory structure is the Bit Cost Scalable (BiCS) architecture which comprises a stack of alternating conductive and dielectric layers. A memory hole is formed in the stack and a vertical NAND string is then formed by filling the memory hole with materials including a charge-trapping layer to create a vertical column of memory cells. Each memory cell can store one or more bits of data.

A non-volatile memory system may store data in a non-volatile memory so that logically related data is stored together. For example, where a stream of logically sequential data is received, the sequential data may be stored together. Where data is received non-sequentially, the data may be stored in the order it is received and may become logically fragmented across a non-volatile memory array, which may lead to inefficiencies in operation of a non-volatile memory system.

BRIEF DESCRIPTION OF THE DRAWINGS

Like-numbered elements refer to common components in the different figures.

FIG. 4D depicts a view of the select gate layers and word line layers.

FIG. 5A shows an example of a non-volatile storage system coupled to a host.

FIG. 5B shows sequential data received by a non-volatile storage system.

FIG. 5C shows non-sequential data received by a non-volatile storage system.

FIG. 13 shows an example of a method that may be implemented in a non-volatile storage system.

DETAILED DESCRIPTION

Figure 1:
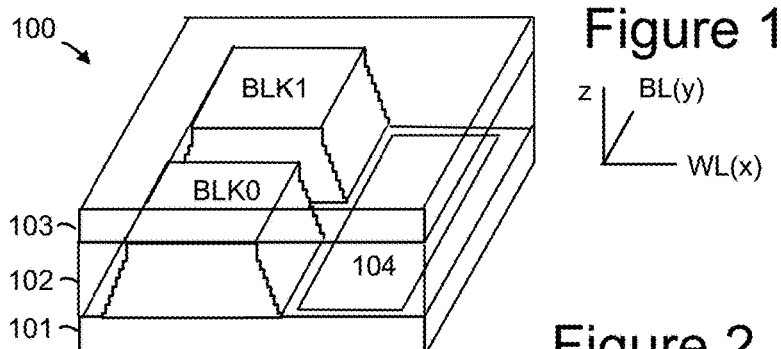
FIG. 1 is a perspective view of a 3D stacked non-volatile storage device.

A non-volatile storage system generally receives memory access commands (e.g. read and write commands) that it executes by accessing non-volatile memory cells. In some cases, a non-volatile storage system may have some indication of what storage access commands are likely to be received and may adapt accordingly (e.g. by performing read look-ahead caching of data that is expected to be requested by a read command). In some cases, likely access commands may be inferred from prior access commands. For example, where a series of access commands are received that are directed to addresses in a sequence, read commands are likely to be received for subsequent addresses in the sequence and appropriate action may be taken. For example, read commands directed to addresses 1, 2, and 3 may indicate sequential read commands so that a read command directed to address 4 is likely and corresponding data with address 4 may be prefetched accordingly. Thus, the data is already buffered when the read command for address 4 is received so that the data can be returned rapidly, and the read command can be completed.

Where memory access requests are not sequential and do not follow any pattern indicated by a host, a storage system may execute memory access commands in the order in which they are received which may be inefficient. For example, logically related data may be distributed across multiple blocks of a block-erasable memory and individual blocks may contain fragments of logically unrelated data. Such fragmentation may increase garbage collection and reduce performance. In some cases, memory access commands that are generated sequentially by memory users such as virtual machines in a server may be received non-sequentially by a non-volatile storage system because memory access commands from multiple memory users are combined into a non-sequential order prior to receipt by the non-volatile storage system. Such a stream of memory access commands may not follow a clear pattern and may change over time according to server configuration so that it may be difficult to configure a storage system to efficiently handle such memory access commands.

In some cases, non-sequential memory access commands may be predicted by using machine learning techniques applied to a set of memory access commands to develop a model. The model may be tested using a test set of memory access commands to determine if the model is sufficiently accurate (i.e. if predicted memory access commands correlate sufficiently with actual memory access commands). The model may be modified if it is not sufficiently accurate. A number of modification and testing iterations may be performed until a sufficiently accurate model is obtained or some maximum number of iterations have been performed.

A model developed in this way may be used to generate predicted memory access commands that allow a non-volatile storage system to achieve certain efficiencies. For example, a predicted read command for a specified address may allow the data with that address to be prefetched before the command is received so that the requested data may be rapidly returned. A predicted write command may allow more efficient writing by deferring writing of previously received data until the write command and its corresponding data are received and the corresponding data may be written in parallel with the portions of received data that were previously received. Thus, logically related data (such as sequential data) may be written together and logical fragmentation may be reduced. A block may be maintained as an open block where a predicted write command is directed to data that is logically associated with data contained in the block. For example, where at least some of the data in the block is sequential, and a predicted write command is directed to another address in the sequence, a location in the block may be maintained and the block may be kept open to write that data when it is received. Multiple open blocks may be maintained for different logically associated data (e.g. for different data streams that are intermingled).

FIGS. 1-4F describe one example of a storage system that can be used to implement the technology proposed herein. FIG. 1 is a perspective view of a storage system that includes three-dimensional (3D) stacked non-volatile memory. The storage device 100 includes a substrate 101. On and above the substrate are example blocks of memory cells, including BLK0 and BLK1, formed of memory cells (non-volatile memory elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the storage device. In an upper region 103 of the storage device, one or more upper metal layers are patterned in conductive paths to carry signals of the circuits. Each block of memory cells comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the storage device.

Figure 2:
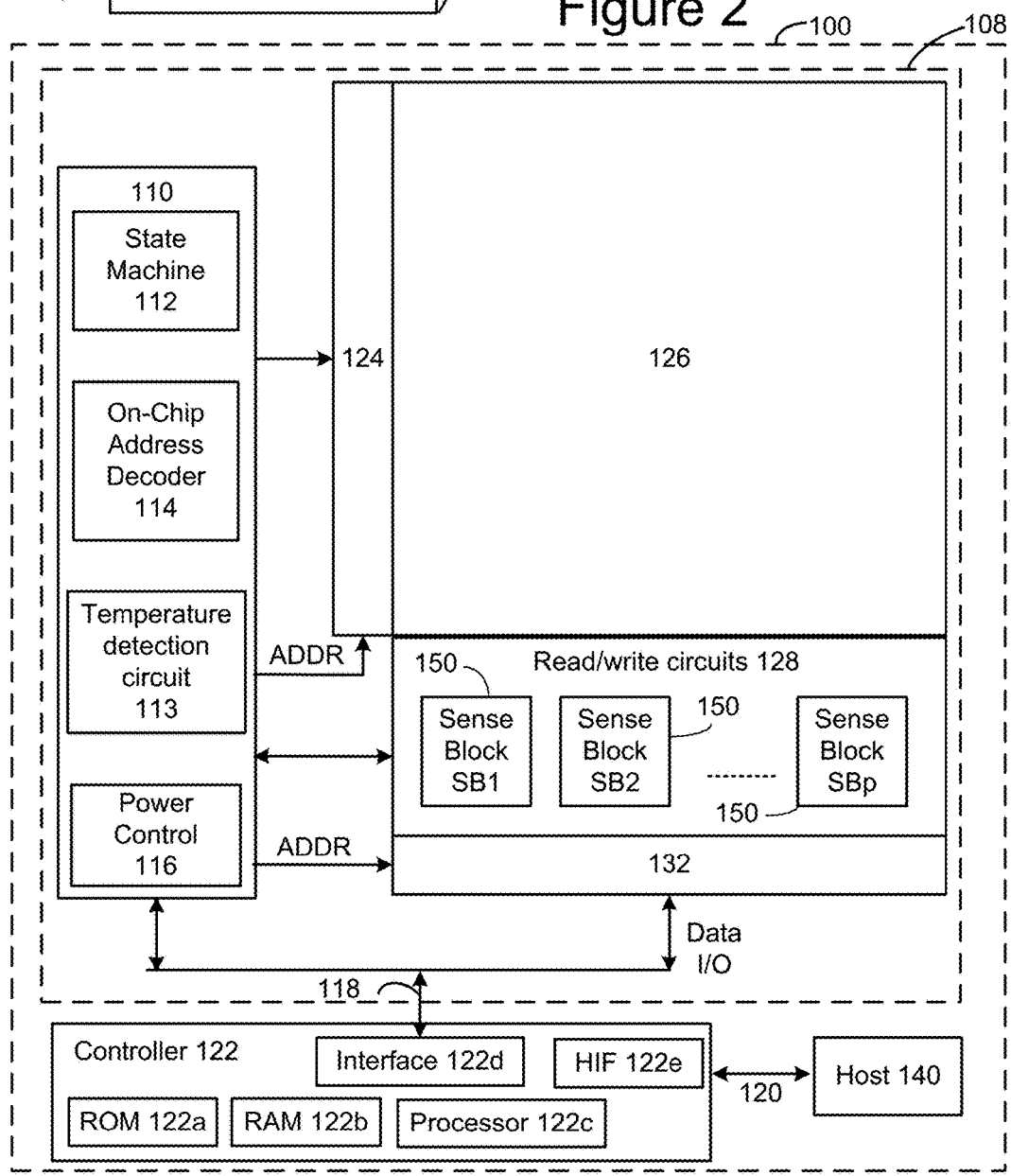
FIG. 2 is a functional block diagram of a storage device of FIG. 1.

FIG. 2 is a functional block diagram of an example storage device such as the 3D stacked non-volatile storage device 100 of FIG. 1. The components depicted in FIG. 2 are electrical circuits. Storage device 100 includes one or more memory die 108. Each memory die 108 includes a three-dimensional memory structure 126 of memory cells (such as, for example, a 3D array of memory cells), control circuitry 110, and read/write circuits 128. In other embodiments, a two-dimensional array of memory cells can be used. Memory structure 126 is addressable by word lines via a decoder 124 (row decoder) and by bit lines via a column decoder 132. The read/write circuits 128 include multiple sense blocks 150 including SB1, SB2, . . . , SBp (sensing circuitry) and allow a page of memory cells to be read or programmed in parallel. In some systems, a Controller 122 is included in the same storage device, such as storage device 100 (e.g., a removable storage card) as the one or more memory die 108. However, in other systems, the Controller can be separated from the memory die 108. In some embodiments, the Controller will be on a different die than the memory die. In some embodiments, one Controller 122 will communicate with multiple memory die 108. In other embodiments, each memory die 108 has its own Controller. Commands and data are transferred between the host 140 and Controller 122 via a data bus 120, and between Controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three-dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides chip-level control of memory operations. Temperature detection circuit 113 is configured to detect temperature, and can be any suitable temperature detection circuit known in the art. In one embodiment, state machine 112 is programmable by the software. In other embodiments, state machine 112 does not use software and is completely implemented in hardware (e.g., electrical circuits). In one embodiment, control circuitry 110 includes registers, ROM fuses and other devices for storing default values such as base voltages and other parameters.

The on-chip address decoder 114 provides an address interface between addresses used by host 140 or Controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, temperature detection circuit 113, power control module 116, sense blocks 150, read/write circuits 128, and Controller 122 can be considered one or more control circuits (or a managing circuit) that performs the functions described herein.

Controller 122 (which in one embodiment is an electrical circuit that may be on-chip or off-chip) may comprise one or more processors 122c, ROM 122a, RAM 122b, Memory interface 122d and Host Interface 122e, all of which are interconnected. One or more processors 122C is one example of a control circuit. Other embodiments can use state machines or other custom circuits designed to perform one or more functions. Devices including ROM 122a, RAM 122b may comprise code such as a set of instructions, and the processor 122c is operable to execute the set of instructions to provide the functionality described herein. Alternatively, or additionally, processor 122c can access code from a memory device in the memory structure, such as a reserved area of memory cells connected to one or more word lines. Memory interface 122d, in communication with ROM 122a, RAM 122b and processor 122c, is an electrical circuit that provides an electrical interface between Controller 122 and memory die 108. For example, memory interface 122d can change the format or timing of signals, provide a buffer, isolate from surges, latch I/O, etc. Processor 122C can issue commands to control circuitry 110 (or any other component of memory die 108) via Memory interface 122d. Host Interface 122e in communication with ROM 122a, RAM 122b and processor 122c, is an electrical circuit that provides an electrical interface between Controller 122 and host 140. For example, Host Interface 122e can change the format or timing of signals, provide a buffer, isolate from surges, latch I/O, etc. Commands and data from host 140 are received by Controller 122 via Host Interface 122e. Data sent to host 140 are transmitted via Host Interface 122e.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three-dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in they direction) with each column having multiple memory cells. The vertical columns may be arranged in a two-dimensional configuration, e.g., in an x-y plane, resulting in a three-dimensional arrangement of memory cells, with memory cells on multiple vertically stacked memory planes. Other configurations of memory elements in three dimensions can also constitute a three-dimensional memory array.

By way of non-limiting example, in a three-dimensional NAND memory array, the memory elements may be coupled together to form vertical NAND strings that traverse across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
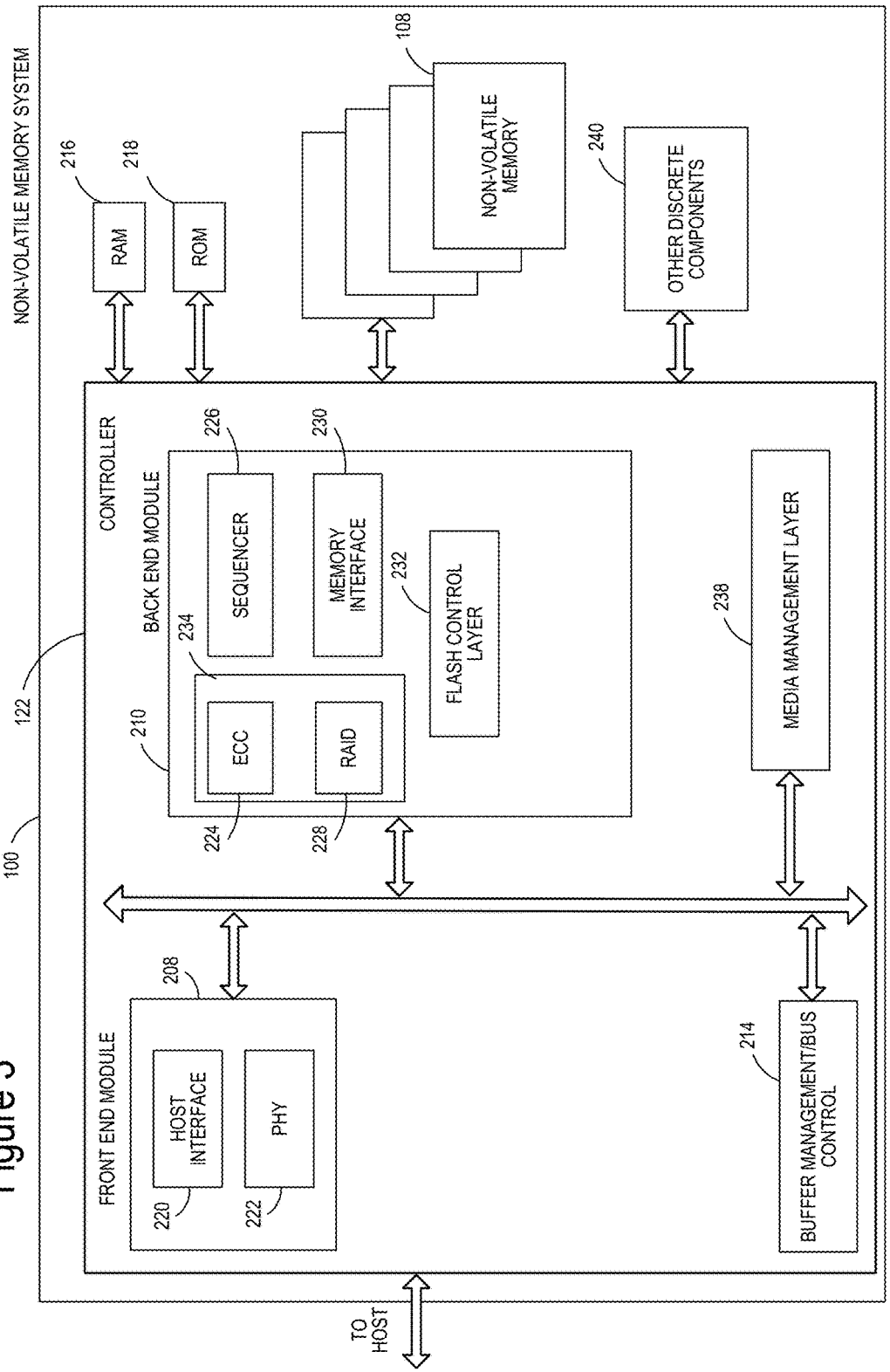
FIG. 3 is a block diagram depicting one embodiment of a Controller.

FIG. 3 is a block diagram of example storage system 100, depicting more details of Controller 122. In one embodiment, the system of FIG. 3 is a solid-state drive (SSD). As used herein, a flash memory Controller is a device that manages data stored on flash memory and communicates with a host, such as a computer or electronic device. A flash memory Controller can have various functionality in addition to the specific functionality described herein. For example, the flash memory Controller can format the flash memory to ensure the memory is operating properly, map out bad flash memory cells, and allocate spare memory cells to be substituted for future failed memory cells. Some part of the spare memory cells can be used to hold firmware to operate the flash memory Controller and implement other features. In operation, when a host needs to read data from or write data to the flash memory, it will communicate with the flash memory Controller. If the host provides a logical address to which data is to be read/written, the flash memory Controller can convert the logical address received from the host to a physical address in the flash memory. (Alternatively, the host can provide the physical address). The flash memory Controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused). Non-volatile memories other than flash may have non-volatile memory controllers that are similar to flash memory controllers.

The communication interface between Controller 122 and non-volatile memory die 108 may be any suitable flash interface, such as Toggle Mode 200, 400, or 800. In one embodiment, storage system 100 may be a card based system, such as a secure digital (SD) or a micro secure digital (micro-SD) card. In an alternate embodiment, storage system 100 may be part of an embedded storage system. For example, the flash memory may be embedded within the host, such as in the form of a solid-state disk (SSD) drive installed in a personal computer.

In some embodiments, storage system 100 includes a single channel between Controller 122 and non-volatile memory die 108, the subject matter described herein is not limited to having a single memory channel. For example, in some storage system architectures, 2, 4, 8 or more channels may exist between the Controller and the memory die, depending on Controller capabilities. In any of the embodiments described herein, more than a single channel may exist between the Controller and the memory die, even if a single channel is shown in the drawings.

As depicted in FIG. 3, Controller 122 includes a front-end module 208 that interfaces with a host, a back-end module 210 that interfaces with the one or more non-volatile memory die 108, and various other modules that perform functions which will now be described in detail.

The components of Controller 122 depicted in FIG. 3 may take the form of a packaged functional hardware unit (e.g., an electrical circuit) designed for use with other components, a portion of a program code (e.g., software or firmware) executable by a (micro)processor or processing circuitry (or one or more processors) that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, each module may include or comprise software stored in a processor readable device (e.g., memory) to program one or more processors for Controller 122 to perform the functions described herein. The architecture depicted in FIG. 3 is one example implementation that may (or may not) use the components of Controller 122 depicted in FIG. 2 (i.e. RAM, ROM, processor, interface).

Referring again to modules of the Controller 122, a buffer manager/bus Controller 214 manages buffers in random access memory (RAM) 216 and controls the internal bus arbitration of Controller 122. A read only memory (ROM) 218 stores system boot code. Although illustrated in FIG. 3 as located separately from the Controller 122, in other embodiments one or both of the RAM 216 and ROM 218 may be located within the Controller. In yet other embodiments, portions of RAM and ROM may be located both within the Controller 122 and outside the Controller. Further, in some implementations, the Controller 122, RAM 216, and ROM 218 may be located on separate semiconductor die.

Front-end module 208 includes a host interface 220 and a physical layer interface 222 (PHY) that provide the electrical interface with the host or next level storage Controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 may be a communication interface that facilitates transfer for data, control signals, and timing signals.

Back-end module 210 includes an error correction Controller (ECC) engine, ECC engine 224, that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the storage system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. ECC engine 224 and RAID module 228 both calculate redundant data that can be used to recover when errors occur and may be considered examples of redundancy encoders. Together, ECC engine 224 and RAID module 228 may be considered to form a combined redundancy encoder 234. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back-end module 210.

Additional components of storage system 100 illustrated in FIG. 3 include media management layer 238, which performs wear leveling of memory cells of non-volatile memory die 108. Storage system 100 also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus Controller 214 are optional components that are not necessary in the Controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the storage device firmware which translates writes from the host into writes to the flash memory structure 126 of memory die 108. The MML 238 may be needed because: 1) the flash memory may have limited endurance; 2) the flash memory structure 126 may only be written in multiples of pages; and/or 3) the flash memory structure 126 may not be written unless it is erased as a block (i.e. a block may be considered to be a minimum unit of erase and such a non-volatile memory may be considered a block-erasable non-volatile memory). The MML 238 understands these potential limitations of the flash memory structure 126 which may not be visible to the host. Accordingly, the MML 238 attempts to translate the writes from host into writes into the flash memory structure 126.

Controller 122 may interface with one or more memory die 108. In in one embodiment, Controller 122 and multiple memory dies (together comprising storage system 100) implement a solid-state drive (SSD), which can emulate, replace or be used instead of a hard disk drive inside a host, as a NAS device, etc. Additionally, the SSD need not be made to work as a hard drive.

Figure 4:
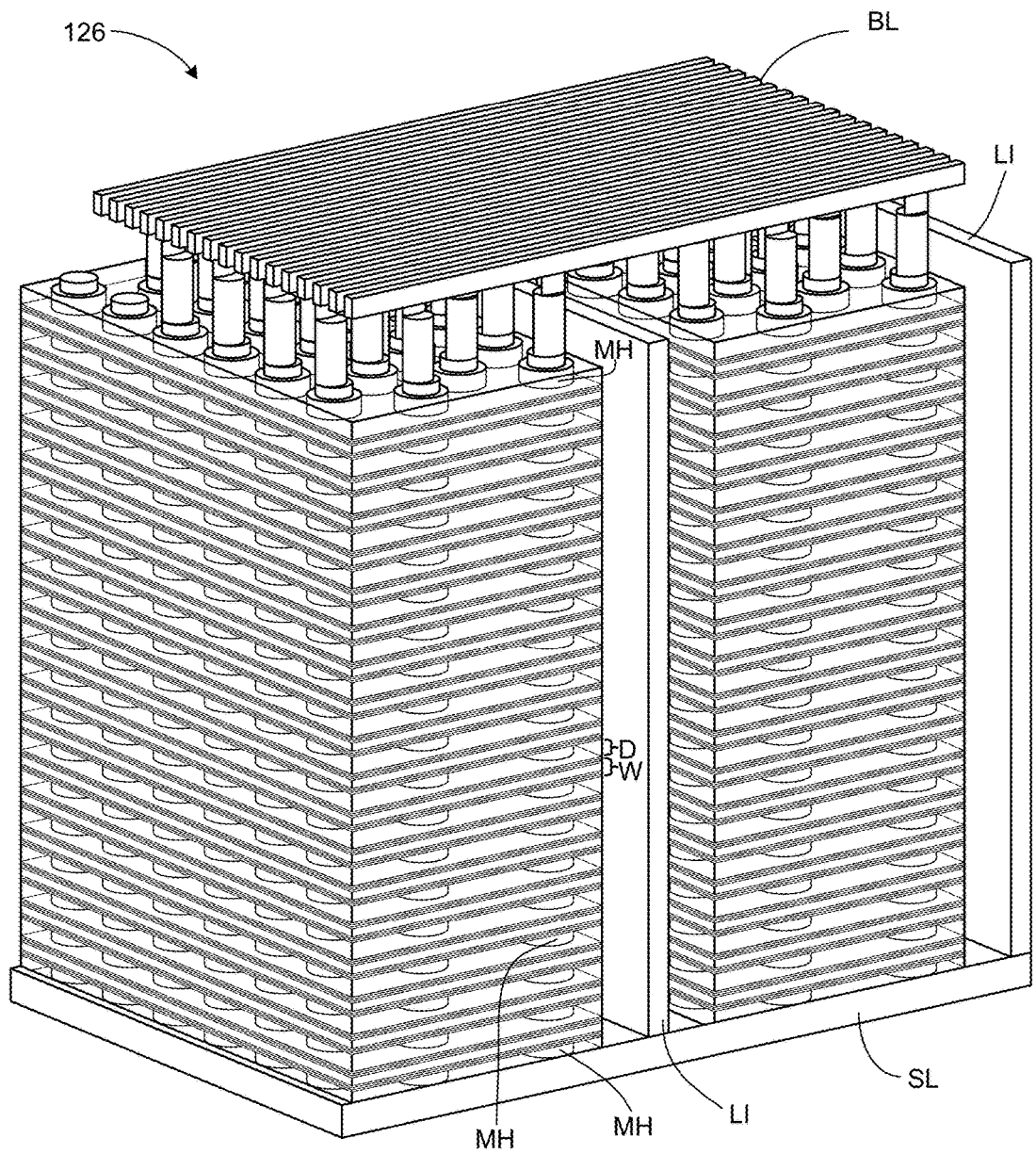
FIG. 4 is a perspective view of a portion of one embodiment of a three-dimensional monolithic memory structure.

FIG. 4 is a perspective view of a portion of a three-dimensional memory structure 126, which includes a plurality memory cells. For example, FIG. 4 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. As will be explained below, the alternating dielectric layers and conductive layers are divided into four "fingers" by local interconnects LI. FIG. 4 only shows two fingers and two local interconnects LI. Below and the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three-dimensional memory structure 126 is provided below with respect to FIG. 4A-4F.

Figure 4A:
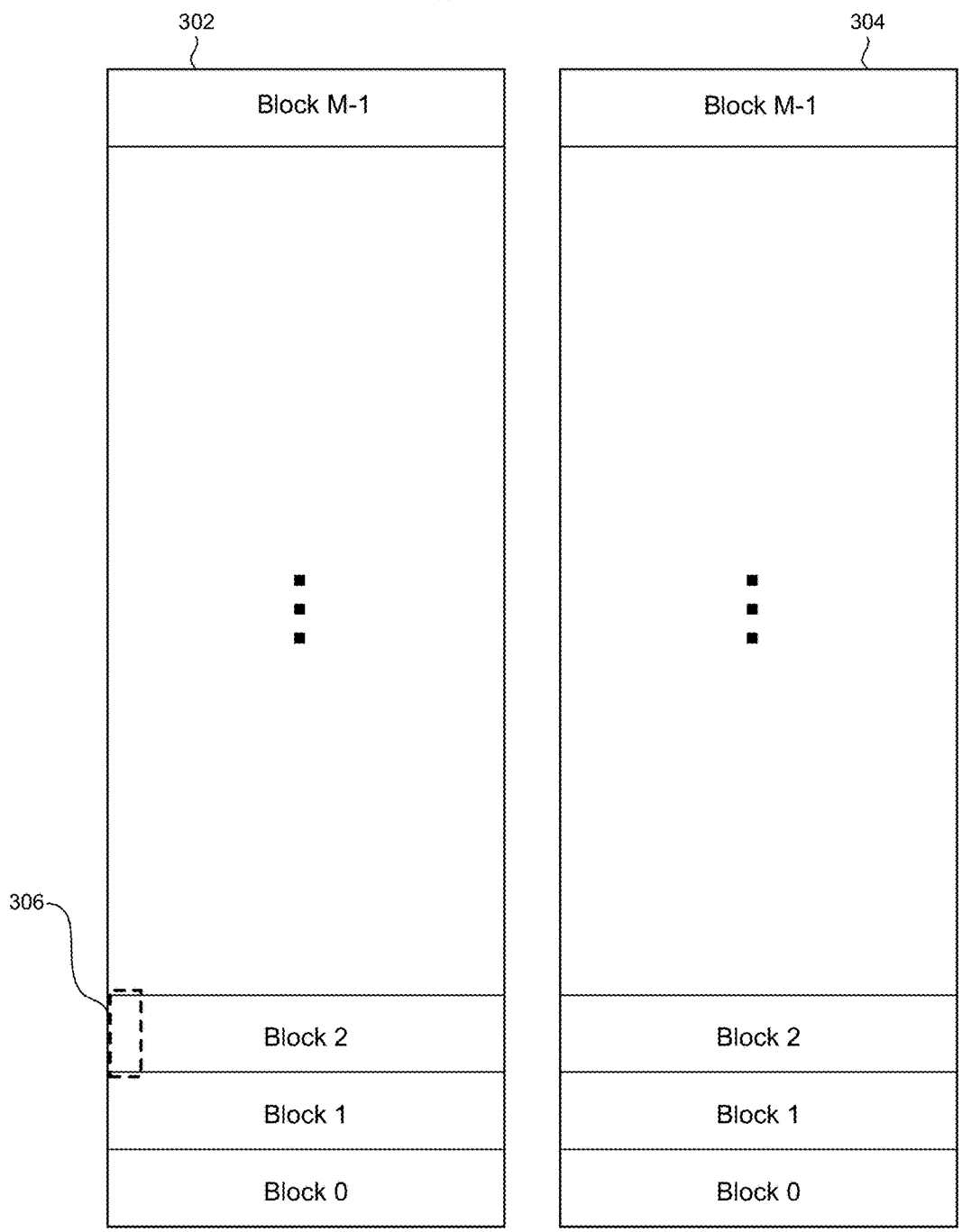
FIG. 4A is a block diagram of a memory structure having two planes.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 302 includes block 0, 2, 4, 6, . . . and plane 304 includes blocks 1, 3, 5, 7, . . . In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits.

Figure 4B:
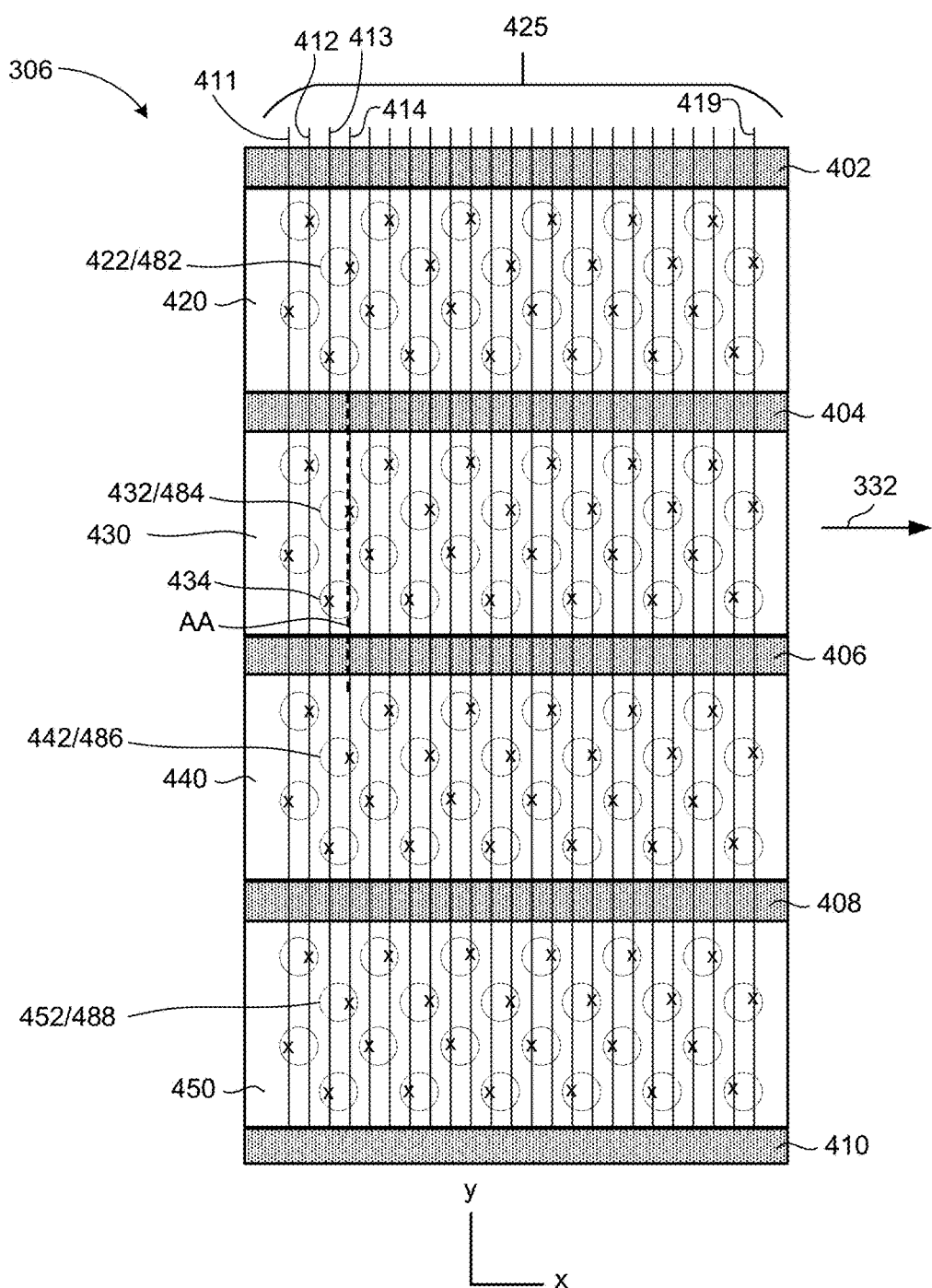
FIG. 4B depicts a top view of a portion of a block of memory cells.

FIGS. 4B-4F depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array will have 60 layers. Other embodiments have less than or more than 60 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. For example, FIG. 4B shows vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 330 and in the direction of arrow 332, the block includes more vertical columns than depicted in FIG. 4B

FIG. 4B also depicts a set of bit lines 425, including bit lines 411, 412, 413, 414, . . . 419. FIG. 4B shows twenty-four bit lines because only a portion of the block is depicted. It is contemplated that more than twenty-four bit lines connected to vertical columns of the block. Each of the circles representing vertical columns has an "x" to indicate its connection to one-bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line.

In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side select lines and the drain side select lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
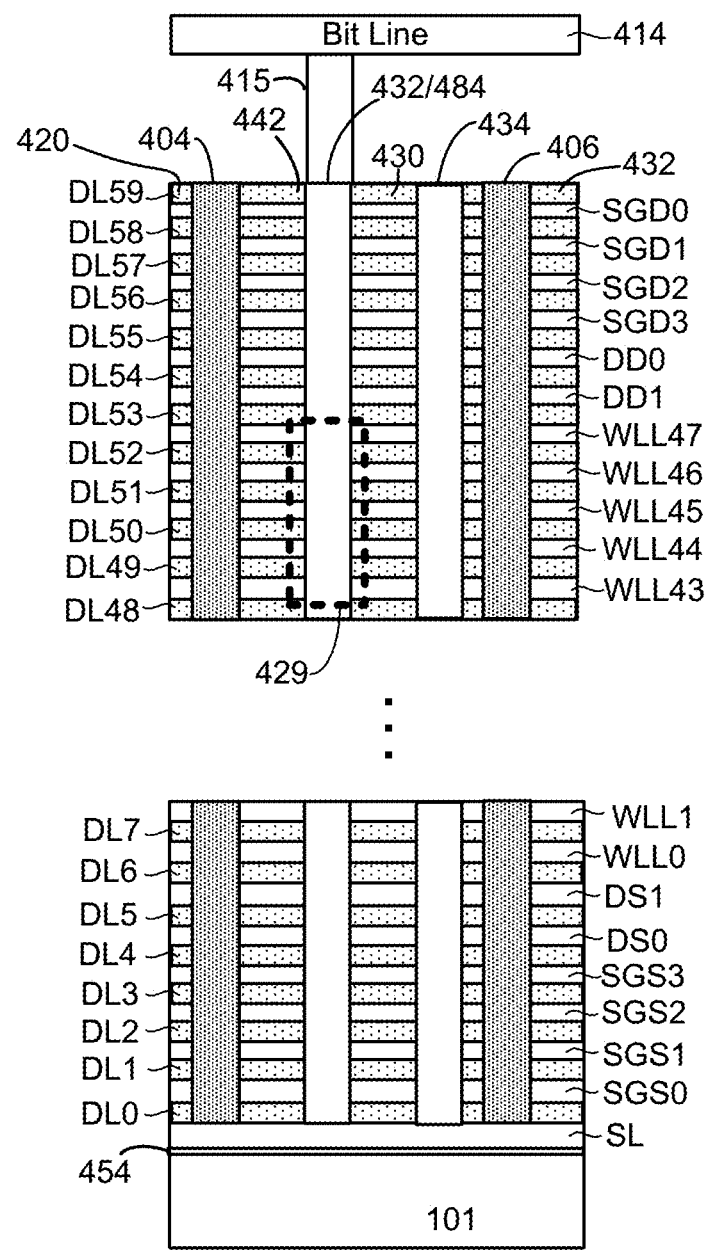
FIG. 4C depicts a cross sectional view of a portion of a block of memory cells.

FIG. 4C depicts a portion of an embodiment of three-dimensional memory structure 126 showing a cross-sectional view along line AA of FIG. 4B. This cross-sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; four dummy word line layers DD0, DD1, DS0 and DS1; and forty-eight data word line layers WLL0-WLL47 for connecting to data memory cells. Other embodiments can implement more or less than four drain side select layers, more or less than four source side select layers, more or less than four dummy word line layers, and more or less than forty-eight-word line layers (e.g., 96 word line layers). Vertical columns 432 and 434 are depicted protruding through the drain side select layers, source side select layers, dummy word line layers and word line layers. In one embodiment, each vertical column comprises a NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to bit lines 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DD0, DD1, DS0 and DS1 connect to dummy memory cells. A dummy memory cell does not store user data, while a data memory cell is eligible to store user data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL47) for the block that is partially depicted in FIG. 4C. As mentioned above with respect to FIG. 4B, in one embodiment, local interconnects 402, 404, 406, 408 and 410 break up each conductive layer into four regions or fingers. For example, word line layer WLL31 is divided into regions 460, 462, 464 and 466. For word line layers (WLL0-WLL31), the regions are referred to as word line fingers; for example, word line layer WLL46 is divided into word line fingers 460, 462, 464 and 466. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 4E:
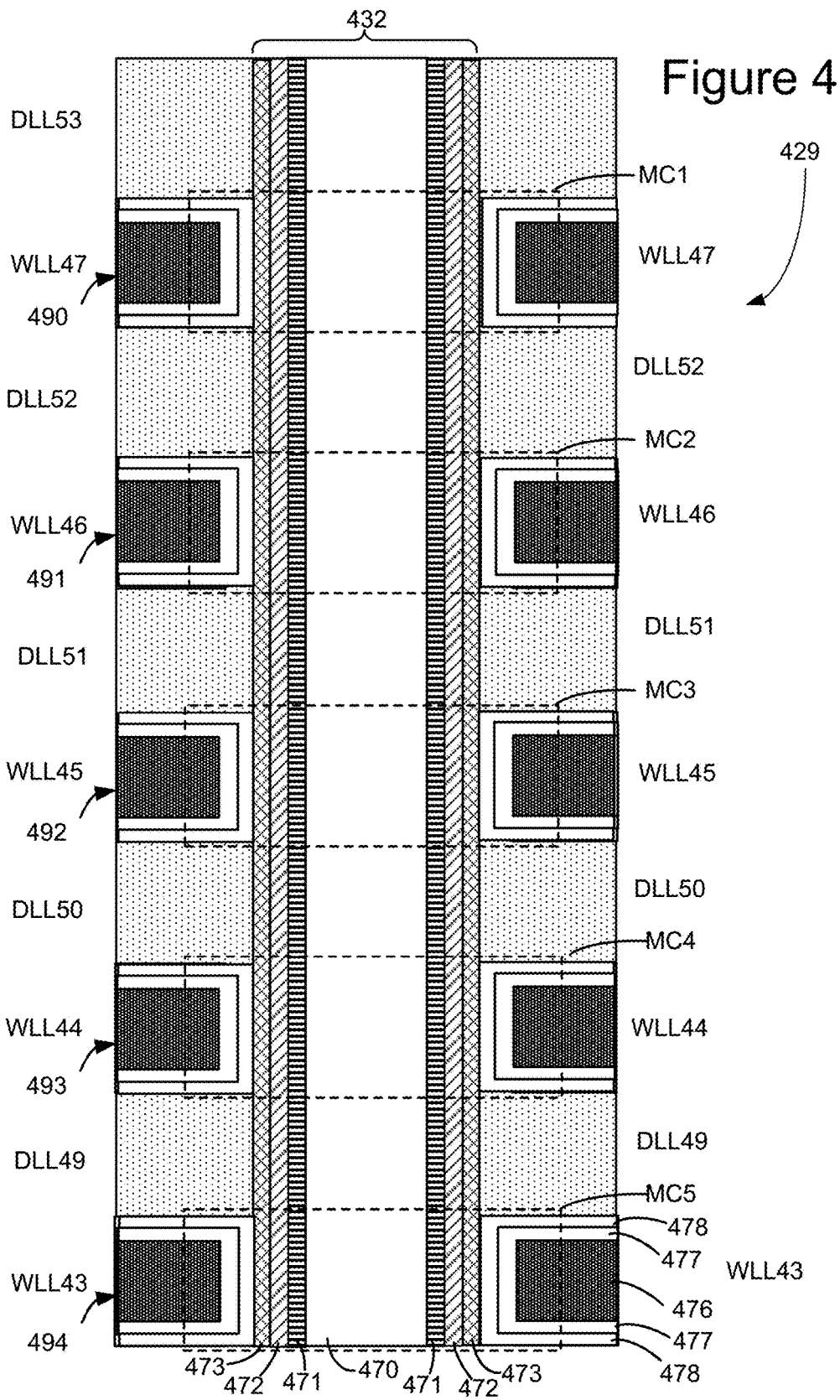
FIG. 4E is a cross sectional view of a vertical column of memory cells.

FIG. 4E depicts a cross sectional view of region 429 of FIG. 4C that includes a portion of vertical column 432. In one embodiment, the vertical columns are round and include four layers; however, in other embodiments more or less than four layers can be included and other shapes can be used. In one embodiment, vertical column 432 includes an inner core 470 that is made of a dielectric, such as SiO$_2$. Other materials can also be used. Surrounding inner core 470 is a polysilicon channel, channel 471. Materials other than polysilicon can be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide layer 478 (SiO2). The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming a non-volatile storage system is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
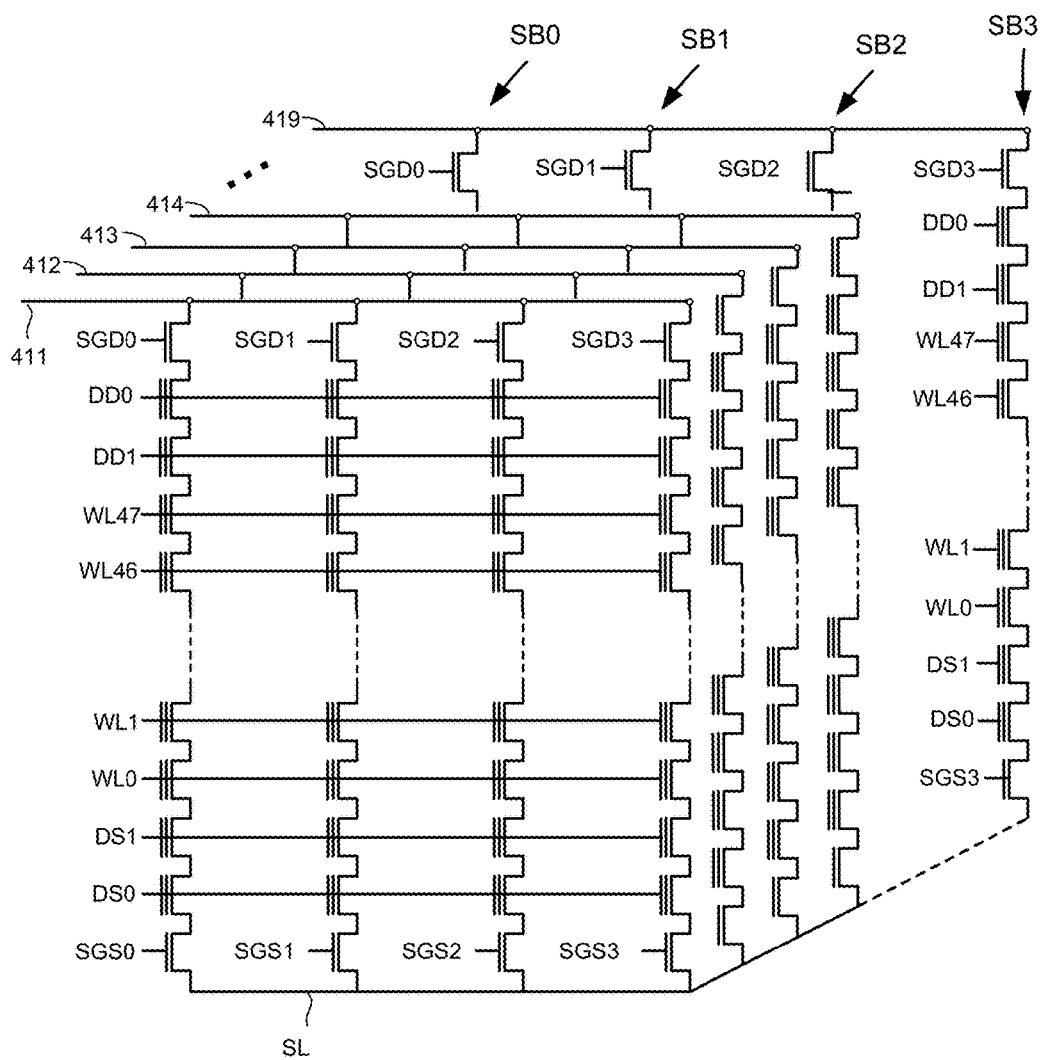
FIG. 4F is a schematic of a plurality of NAND strings.

FIG. 4F shows physical word lines WLL0-WLL47 running across the entire block. The structure of FIG. 4F corresponds to portion 306 in Block 2 of FIGS. 4A-B, including bit lines 411, 412, 413, 414, . . . 419. Within the block, each bit line connected to four NAND strings. Drain side select lines SGD0, SGD1, SGD2 and SGD3 are used to determine which of the four NAND strings connect to the associated bit line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 4-4F is a three-dimensional memory structure that includes vertical NAND strings with charge-trapping material, other (2D and 3D) memory structures can also be used with the technology described herein. For example, floating gate memories (e.g., NAND-type and NOR-type flash memory ReRAM memories, magnetoresistive memory (e.g., MRAM), and phase change memory (e.g., PCRAM) can also be used.

One example of a ReRAM memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data using magnetic elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming a non-volatile memory system, each memory cell lies between a pair of write lines arranged at right angles to each other, parallel to the memory cell, one above and one below the memory cell. When current is passed through them, an induced magnetic field is created.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

FIG. 5A shows a simplified example of a non-volatile storage system 500 that is coupled to a host system 502. Non-volatile storage system 500 may be similar to non-volatile storage system 100 as shown in FIGS. 1-3. Non-volatile storage system 500 includes non-volatile memory 504, that is formed by N non-volatile memory dies, Die 1 to Die N, where N may be any suitable number, e.g. 4, 8, 16, or more. Dies 1-N may be similar to memory die 108 and may have a three-dimensional non-volatile memory structure as described with respect to FIGS. 4-4F, or other memory structure. Non-volatile storage system 500 also includes memory controller 506, which may be similar to controller 122 as shown in FIG. 3. Non-volatile storage system 500 further includes interface circuits 508 that interface with corresponding interface circuits 510 of host system 502 (e.g. through a bus, connector, or other coupling).

In some embodiment, blocks of memory cells in non-volatile memory 504 are linked together to form "superblocks" or "metablocks" which are groups of blocks that are accessed together and are treated as if they collectively formed a single block. Thus, all blocks of a superblock are erased together as a unit. A superblock may be considered the minimum unit of erase in such a memory. FIG. 5 shows superblock 512 that includes blocks from each of Die 1 to Die N. Blocks in an individual die of Die 1 to Die N may be arranged in planes as shown in FIG. 4A. Configuring blocks in superblocks allows a high degree of parallel operation which can provide high read and write speeds. Using such large units of erase (e.g. N times bigger than an individual block, or 2N times bigger for dies with two planes) has an effect on garbage collection. A superblock may contain a range of logically unrelated data that requires garbage collection as data is updated. A relatively large amount of data may be copied during garbage collection of a superblock, which may have an impact on other non-volatile memory operations.

In one example, host system 502 includes four virtual machines, $VM_A$ to $VM_D$. A virtual machine is an emulation of a computer system so that each virtual machine, $VM_A$ to $VM_D$, may act independently (e.g. running different operating systems). Virtual machines $VM_A$ to $VM_D$ are memory users that send data to non-volatile storage system 500 for storage and request stored data from non-volatile storage system 500. Thus, virtual machines $VM_A$ to $VM_D$ generate memory access commands, including read commands and write commands, that are sent to non-volatile storage system 500. Memory controller 506 receives memory access commands and manages reading data from non-volatile memory 504 and writing data to non-volatile memory 504. Efficiently operating a block-erasable non-volatile memory such as in non-volatile storage system 500 in response to such commands may be challenging.

FIG. 5B illustrates an example of sequential memory access commands A1 to A4 sent by host system 502 to non-volatile storage system 500 via interface circuits 510 (interface circuits 508 are omitted for simplicity). For example, memory access commands A1 to A4 may be write commands with corresponding data that is written in superblock 512. In this example, memory controller 506 may recognize that sequential data is being received and may select storage locations accordingly so that logically sequential data is stored together. This may facilitate more efficient reading of this data when read commands are received sequentially and may facilitate more efficient garbage collection. Where a non-volatile storage system receives write commands sequentially, a storage system may recognize this and may take advantage of such sequentially received data to store data efficiently and avoid unnecessary logical fragmentation of data. Where non-volatile memory is accessed by multiple memory users (e.g. multiple host systems and/or multiple virtual machines in a host system) data may be sequentially received less frequently even when it is sent sequentially by memory users.

FIG. 5C illustrates an example where virtual machines $VM_A$ to $VM_D$ each send memory access commands sequentially (e.g. $VM_A$ sends memory access commands with addresses A1, A2, and A3, $VM_B$ sends memory access commands with addresses B1, B2, and B3, and so on). These memory access commands are serialized by interface circuits 510 for sending to non-volatile storage system 500 so that the memory access commands are not sequentially ordered when they are received by non-volatile storage system 500. Such non-sequentially received read and write commands may not have any apparent pattern. In this example, memory access commands are interleaved in order A, B, C, D, however it will be understood that combined command sequences may not be ordered in this way and that individual virtual machines do not always send commands sequentially so that a sequence of received memory access commands may be more randomized than shown in this simplified illustration. In the example of write commands, data corresponding to addresses A1, B1, C1 and D1 are written in the order in which they are received so that they are stored together in superblock 512 as shown. Thus, four different portions of logically unrelated data are stored together in superblock 512. Subsequent reading of such fragmented data may require accessing many blocks and garbage collection may require copying large amounts of data. Attempting to configure a non-volatile storage system to efficiently manage data received in this way is challenging because host configuration may be unknown and may change over time (e.g. the number of virtual machines may be unknown and may vary over time as the host system is reconfigured).

In an example, machine learning techniques may be used to predict memory access commands based on a set of memory access commands used as a training set (teaching set) and a non-volatile storage system may manage memory access operations according to the predicted memory access commands. In this way, a non-volatile storage system that receives memory access commands that are not sequential, and that may have no readily apparent pattern, may be able to predict memory access commands with some level of success depending on how the memory access commands are received. Such a system may use a model that is updated as needed (e.g. if the level of accuracy provided is insufficient) so that the model may adapt to changing patterns of memory access commands. For example, a linear regression model may be used to predict a memory access based on received memory access commands by treating received memory access commands as input variables and treating a predicted memory access command as an output. Addresses of received read or write commands may be combined using different coefficients to generate a predicted read or write command. Thus, the address of a predicted write command may be predicted from received write commands according to the equation:

$$y = \beta_0 + \beta_1 x_1 + \beta_2 x_2 + \beta_3 x_3 + \ldots \beta_n x_n$$

where y is the predicted address, $x_1, x_2, x_3 \ldots x_n$ are received addresses, and $\beta_0, \beta_1, \beta_2, \beta_3, \ldots \beta_n$ are model coefficients. A machine learning model may be modified by changing coefficients. Modifications may be made in multiple iterations until sufficient accuracy is achieved. It will be understood that a variety of machine learning approaches may be applied including decision tree learning, association rule learning, artificial neural networks, deep learning, inductive logic programming, support vector machines, clustering, bayesian networks, reinforcement learning, representation learning, similarity learning, metric learning, sparse dictionary learning, genetic algorithms, rule-based machine learning, learning classifier systems, or other approaches. Machine learning may be implemented using a variety of hardware including one or more processors which may be dedicated processors or may perform one or more other functions and may be implemented in stand-alone hardware or may be integrated with a non-volatile storage system.

Figure 6:
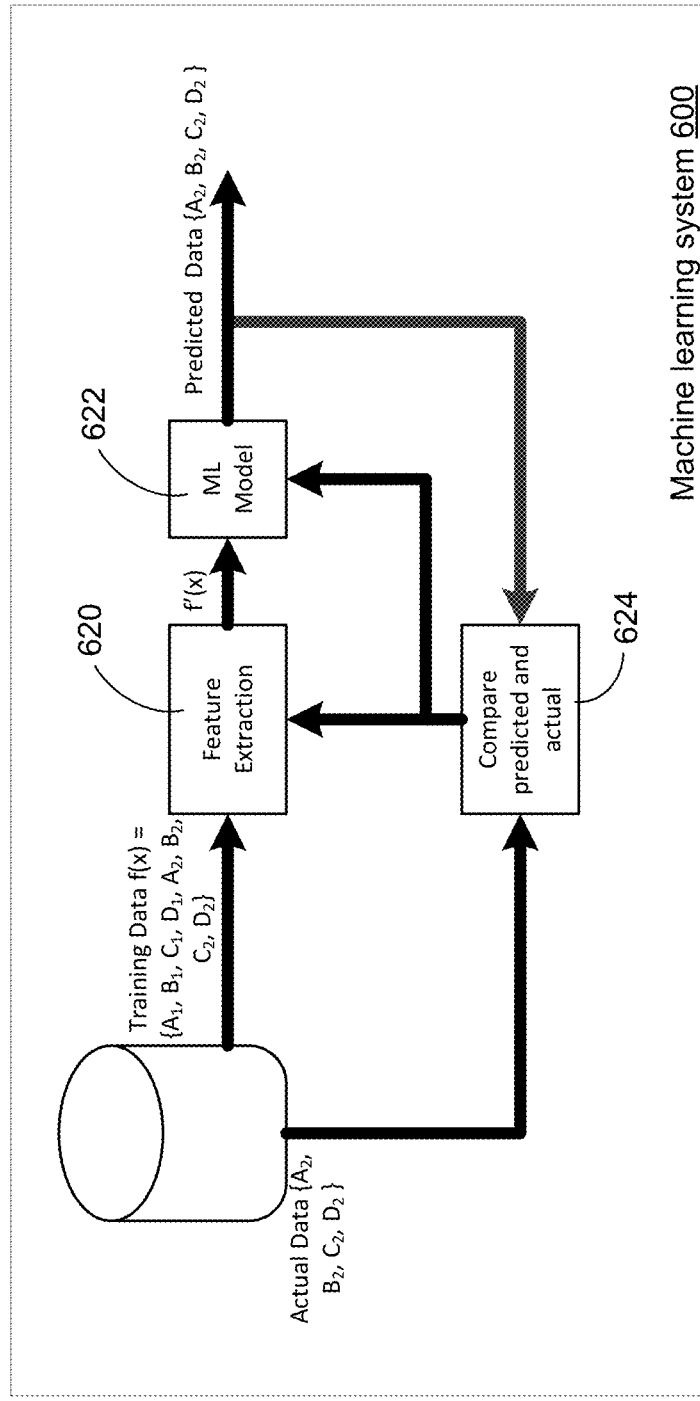
FIG. 6 shows an example of generating a model by machine learning.

FIG. 6 illustrates an example of a machine learning system 600 that generates predicted data $A_2, B_2, C_2, D_2$ from a set of training data f(x) that consists of memory access commands $A_1, B_1, C_1, D_1, A_2, B_2, C_2, D_2$. Machine learning system 600 may be implemented in a memory controller, for example, in controller 122 of FIGS. 1 and 2, or controller 506 of FIG. 5A. Feature extraction module 620 generates, from the training data f(x), features f' (x) that are used to generate a machine learning model 622. Feature extraction module 620 identifies addresses of interest from the training data and the machine learning model 622 tries to find relationships between the test data and future memory access commands and uses these relationships to predict memory access commands $A_2, B_2, C_2, D_2$ from memory access commands $A_1, B_1, C_1, D_1$. The predicted memory access commands are then compared with actual data $A_2, B_2, C_2, D_2$ by comparison module 624. Based on the comparison, comparison module 624 may provide feedback to feature extraction module 620 and machine learning model 622 so that feature extraction and machine learning can be modified (e.g. using different features, focusing on different addresses, and/or using different regression coefficients in the machine learning model 622) until a good model is achieved. The process may then be repeated for another portion of training data to further develop machine learning model 622. After all training data of a training set is processed then the model may be considered ready for testing. Training data may be real data from a non-volatile storage system, for example, non-volatile memory access commands that are logged over some period of time. Thus, training data from a particular non-volatile storage system may be specific to that system and its configuration and may allow a non-volatile storage system to be trained accordingly for that system and configuration. Alternatively, more generic training data may be used. In some cases, training may use simulated data instead of real data.

Figure 7A:
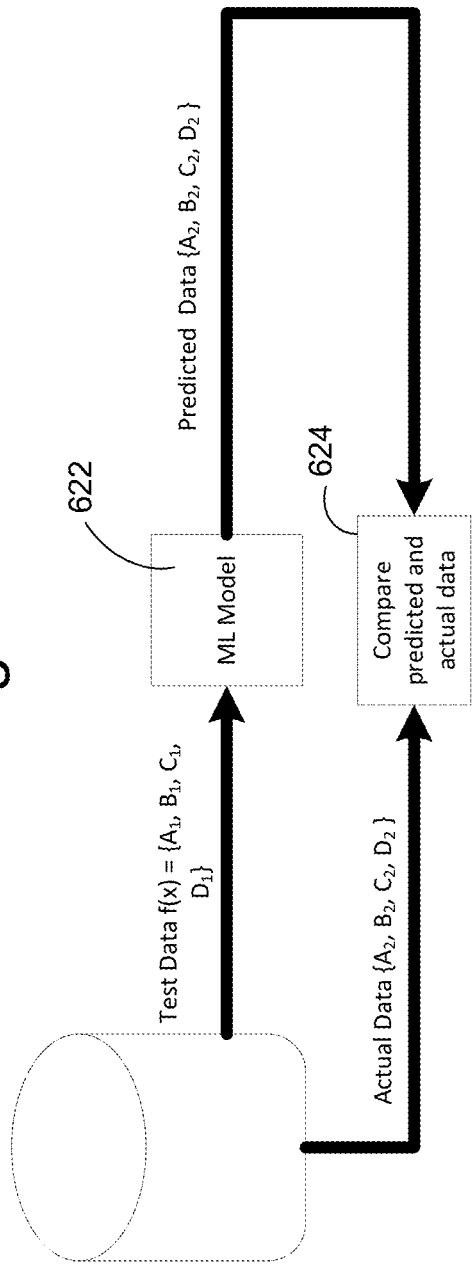
FIGS. 7A-B show an example of testing a machine learning model.
Figure 7B:
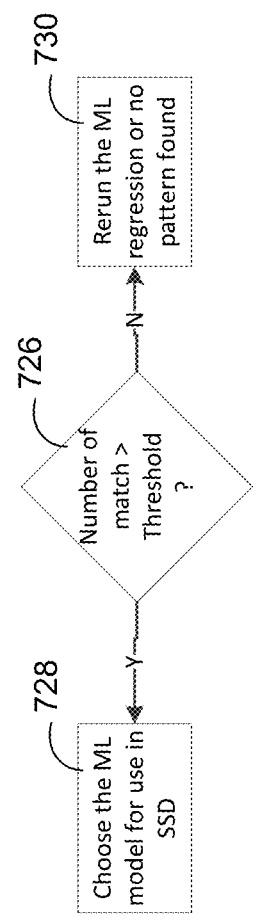

FIGS. 7A-B illustrate an example of testing of machine learning model 622 obtained from the process illustrated in FIG. 6. In FIG. 7A, test data f(x), which includes memory access commands $A_1, B_1, C_1, D_1$ is provided to machine learning model 622, which generates predicted data $A_2, B_2, C_2, D_2$ based on the test data. The predicted output data from machine learning model 622 is compared with test data that includes memory access commands $A_2, B_2, C_2, D_2$ (memory commands subsequent to the commands provided to machine learning model 622) by comparison module 624.

FIG. 7B shows an example of a comparison operation performed by comparison module 624. In this example, the number of matches between predicted data and actual data is compared with a threshold 726. If the number of matches is greater than the threshold then the machine learning model is chosen 728 for use in a non-volatile storage system (in this case an SSD). If the number of matches is not greater than the threshold then the machine learning regression of FIG. 6 may be rerun 730 (i.e. multiple regression cycles may be performed). If the number of matches does not exceed the threshold after a predetermined number of iterations then no pattern is found and the data may not be suitable for use of machine learning (e.g. may be too random). Accordingly, any model developed may not be used in a non-volatile storage system. The memory access commands of FIGS. 6 to 7B may be read or write commands. Generally, read and write commands are separated and a separate model is developed for each. Both models may be used, or only one, or neither. In some cases, write commands may be more predictable than read commands so that the write command model is selected for use while the read command model is not chosen. In other cases, read commands may be more accurately predicted than write commands and the read command model may be selected for use while the write command model is not. A threshold for accuracy of prediction may depend on a number of factors and it will be understood that 100% accuracy is not required and may not generally be achieved.

The process of feature extraction, machine model generation, and testing of FIGS. 6-7B may be repeated. In this way, multiple iterations may be performed to attempt to find a model that predicts memory access commands with sufficient accuracy. The process may continue until a certain level of accuracy is achieved (e.g. a certain number of predicted memory access commands match actual memory access commands), or there is little improvement from iteration to iteration, or until the number of iterations reaches a limit. If the number of iterations reaches the limit without achieving a certain level of accuracy then the training data may simply be too random to allow a sufficient accuracy and the model may not be used. A non-volatile storage system may use a model at times (e.g. when memory access commands are relatively predictable) and may not use a model at other times (e.g. when memory access commands are relatively unpredictable). In many cases, a model may be obtained through multiple regression cycles. The process of feature extraction, machine model generation, and testing of FIGS. 6-7B may be performed by components external to a storage system, such as non-volatile storage system 500, or may be performed by components of a non-volatile storage system. For example, feature extraction module 620 and machine learning model 622 may be implemented in a controller, e.g. by a processor such as processor 122c of FIG.

2 which may be considered a means for generating a machine learning model to predict memory access commands from a plurality of received memory access commands.

Figure 8:
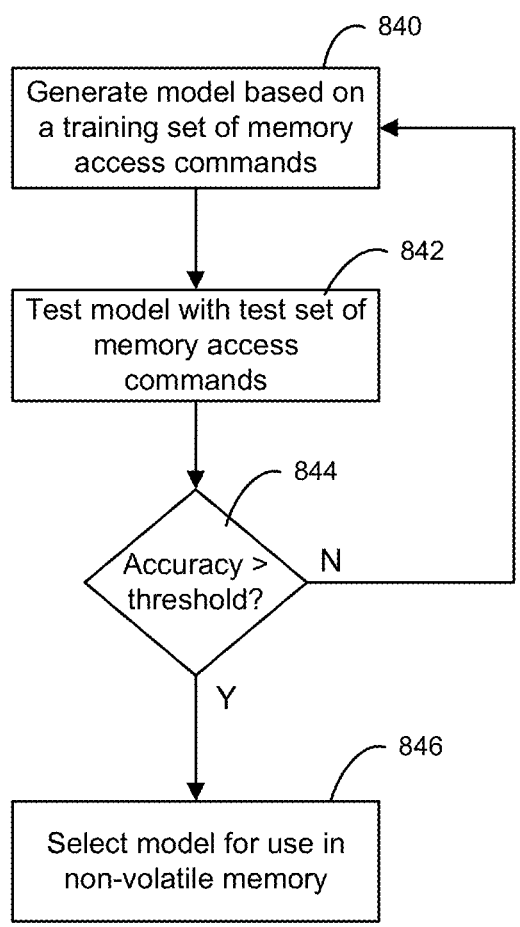
FIG. 8 illustrates an example of a method of generating and testing.

FIG. 8 illustrates an example of a method that includes generating a model based on a training set of memory access commands 840 (e.g. as illustrated in FIG. 6) and testing the model with a test set of memory access commands 842 (e.g. as illustrated in FIGS. 7A-B). If the accuracy of predicted memory access commands generated by the model does not exceed a threshold 844, then these steps are repeated (e.g. generating a new model and testing it). If the accuracy exceeds the threshold 844, then the model is selected for use in non-volatile memory 846. The process of FIG. 8 may be performed at any suitable time, e.g. during initialization of a storage system at a factory, or later during use. In one example, memory access commands may be recorded over a period of time. Such recorded memory access commands may be used to generate and test a model that is based on real-world data and may be customized to a particular memory system used in a particular configuration. Such a model may be updated as required so that it may adapt to changes in memory access command patterns (e.g. as the number and/or configuration of virtual machines change). A model may be generated and tested off-line by a computer system that is remote from the storage system (e.g. a customer may log memory access commands and send them to a memory vender, or third party, to generate and test a model). Alternatively, a model may be generated and tested in a non-volatile storage system by components of the non-volatile storage system itself so that the non-volatile storage system automatically tries to predict memory access commands according to a model and may update the model as appropriate. For example, a memory controller such as controller 122 of FIGS. 2 and 3, or controller 506 of FIG. 5A may be configured to generate and test a machine learning model.

Figure 9:
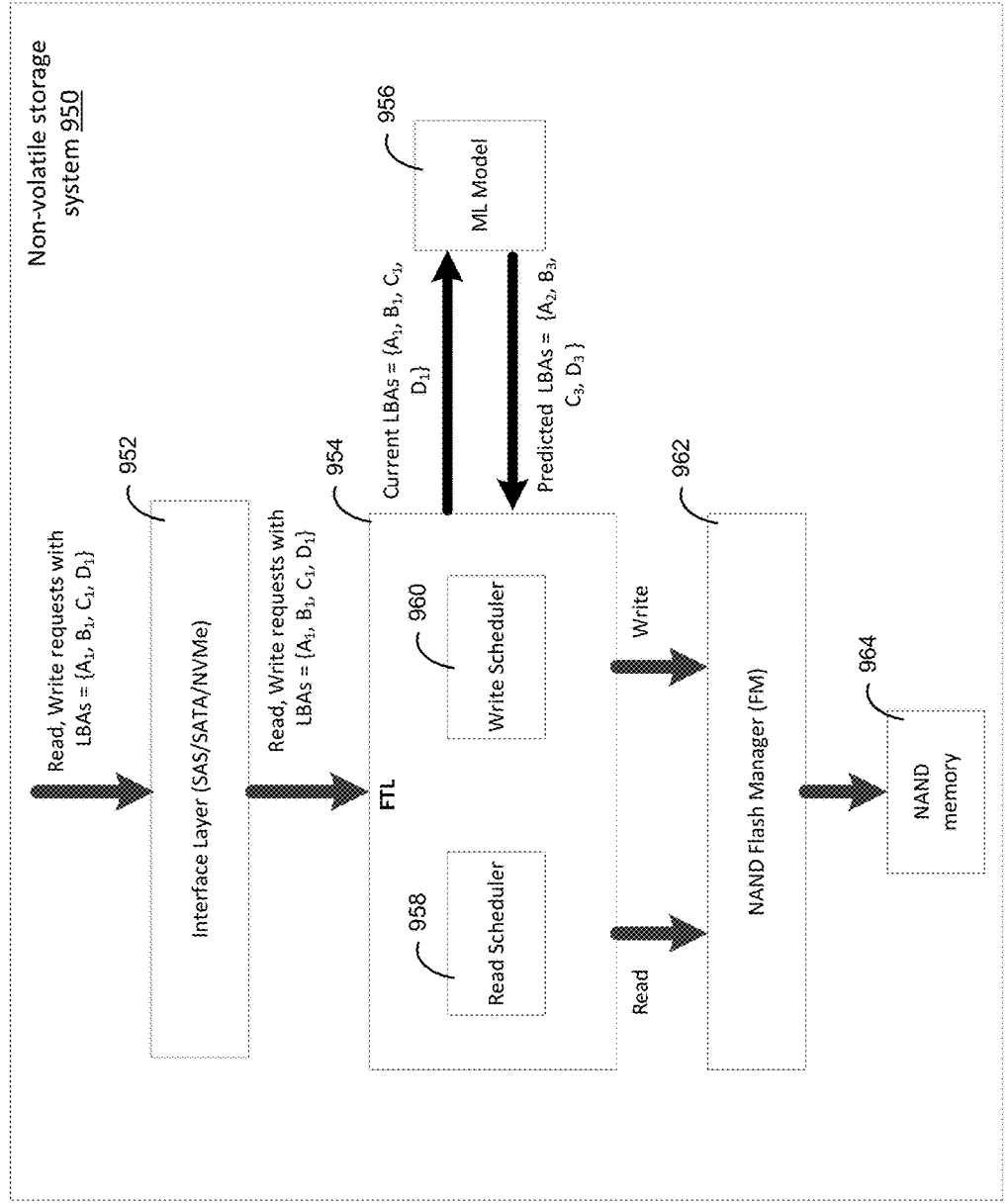
FIG. 9 shows an example of a non-volatile storage system using a machine learning model.

A predictive model for memory access commands may be used in various ways in a non-volatile storage system and may provide a variety of benefits. FIG. 9 illustrates an example of a non-volatile storage system 950 (e.g. an SSD) that uses a model to predict memory read and write commands and that accesses a non-volatile memory according to the predicted memory access command. Non-volatile storage system 950 may be similar to non-volatile storage system 100 of FIGS. 2 and 3 and non-volatile storage system 500 of FIG. 5A. Non-volatile storage system 950 includes interface layer 952, which receives read and write commands from one or more memory users (e.g. from one or more virtual machines operating on one or more host systems). Interface layer 952 may be implemented by components similar to interface 122d in FIG. 2, front end module 208 of FIG. 3, or interface 508 of FIG. 5A. controller 122 Interface layer 952 may interface with a host system using any suitable interface, such as specified by one of the standards indicated (SAS, SATA, NVMe) or otherwise. In the present example, read commands (requests) are received with logical block addresses (LBAs) $A_1$, $B_1$, $C_1$, $D_1$. These read or write requests are sent to flash translation layer (FTL) 954, which may be similar to Media Management Layer (MML) 238 of FIG. 3 and may perform similar functions including translating memory access commands from a host into commands to access physical locations in a flash memory. Addresses received from a host may be treated as logical block addresses (LBAs) that identify particular data and a flash translation layer translates these addresses into physical addresses that refer to particular locations in flash memory. A map, or lookup table, may be record a logical-to-physical mapping. This mapping may change over time as LBAs are remapped when data is updated and blocks are garbage collected.

FTL 954 is coupled to a machine learning model 956, e.g. a machine learning model generated from memory access commands as described above. The addresses of current memory access commands $A_1$, $B_1$, $C_1$, $D_1$ are sent to machine learning model 956, which generates predicted memory access commands $A_2$, $B_3$, $C_3$, $D_3$ accordingly and sends them to FTL 954. Machine learning model 956 may be embodied in a dedicated circuit, configurable circuit, or may be implemented through software running on a general-purpose processor. Machine learning model 956 may be considered one example of a means for generating predicted read and write commands for the set of non-volatile memory cells from a plurality of non-sequentially received read and write commands. Machine learning model may be implemented using a processor such as processor 122c of controller 122 configured using appropriate software and a set of coefficients. Thus, a processor such as processor 122c may be considered a means for generating predicted read and write commands for the set of non-volatile memory cells from a plurality of non-sequentially received read and write commands.

FTL 954 includes read scheduler 958 and write scheduler 960, which schedule read and write commands respectively for execution. Read and write commands scheduled by read scheduler 958 and write scheduler 960 respectively are sent to a NAND flash manager 962 ("FM") which executes the commands on corresponding physical areas of NAND memory 964 (e.g. by reading or writing particular non-volatile memory cells from the set of non-volatile memory cells that form NAND memory 964). Thus, non-volatile storage system 950 includes circuits of interface layer 952 that are configured to receive a plurality of non-sequential memory access commands directed to a set of non-volatile memory cells of NAND memory 964, circuits configured to predict a predicted memory access command based on the plurality of non-sequential memory access commands (e.g. machine learning model 956), and circuits to access the set of non-volatile memory cells according to the predicted memory access command (FTL 954 and NAND flash manager 962). Non-volatile storage system 950 may be considered an example of one or more control circuits in communication with the set of non-volatile memory cells, the one or more control circuits are configured to receive a plurality of non-sequential memory access commands directed to the set of non-volatile memory cells and predict a predicted memory access command based on the plurality of non-sequential memory access commands, the one or more control circuits are configured to access the set of non-volatile memory cells according to the predicted memory access command. Non-volatile storage system 950, FTL 954, or similar components (e.g. controller 122 or media management layer 238 of FIG. 3) configured appropriately (through hardware and/or software) may be considered examples of means for accessing the set of non-volatile memory cells according to the predicted read and write commands prior to receiving the predicted read and write commands.

Read scheduler 958 may schedule a read command based on input from machine learning model 956 in addition to scheduling read commands received from a host through interface layer 952. In the example shown in FIG. 9, a read command may be scheduled at address $A_2$ based on a predicted read command generated by machine learning model 956 even though a read command with address $A_2$ has not been received at the time shown. Subsequently, when a read command with address $A_2$ is received, the corresponding data (e.g. host data with address $A_2$) may have already been read from NAND memory 964 and may be cached or buffered in preparation for the corresponding read command and the data can be rapidly returned to the host.

Write scheduler 960 may schedule a write command based on input from machine learning model 956 in addition to scheduling write commands received from a host through interface layer 952. In the example shown in FIG. 9, one or more write commands may be scheduled based on predicted write commands generated by machine learning model 956. For example, where a predicted write command with address $B_3$ is generated by machine learning model 956 as shown, write scheduler 960 may search pending write commands and may defer writing data that is logically related to data with address $B_3$ (e.g. sequential data with address $B_2$). Subsequently, when a write command with address $B_3$ is received, the corresponding data (i.e. data having address $B_3$) may be written together (e.g. in same superblock) with a portion of data having address $B_2$ (and any other logically related portions of data) so that logically related data is written together and is not fragmented. In some cases, non-volatile storage system 950 may maintain an open location in NAND memory 964 to write data with a predicted address in a block containing data that is logically associated with the predicted address. For example, where a predicted write command with address $B_3$ is generated by machine learning model 956 as shown, non-volatile storage system 950 may maintain a block containing data $B_1$ as an open block and may maintain a location for writing data with address $B_3$ in the open block. Thus, data with addresses $C_1$, $D_1$ may be written elsewhere, in a different block or blocks to the open block containing data with address $B_1$, in order to maintain a location for writing data with address $B_3$. It will be understood that, in a non-volatile storage system, a limited number of blocks may be maintained as open blocks that can accept further data while most blocks are filled with data (or nearly filled) and then closed (e.g. by writing data in the order received until a block is full). Maintaining open blocks generally requires some overhead and so it may be desirable to keep the number of open blocks low.

In addition to predicting memory access commands a machine learning model such as machine learning model 956 may provide additional indicators that may be used in managing a non-volatile storage system. For example, in some cases, machine learning model 956 may generate an indicator of a number of memory users that are sending memory access commands (e.g. the number of virtual machines sending memory write commands). Machine learning model 956 may then adapt accordingly. For example, where machine learning model 956 infers that there are four memory users sending write commands (e.g. four virtual machines of FIG. 5A), a corresponding indicator may be generated and sent to FTL 954. In response, FTL 954 (or other components) may maintain open blocks associated with the different memory users so that data from a given memory user is stored together. For example, four open blocks may be maintained, one for each of the four memory users. In some cases, a single open block may serve more than one memory user (e.g. four open blocks for ten memory users, with each open block serving two or three memory users). By maintaining data received from a given memory user in designated blocks, logical fragmentation may be reduced.

Figure 10:
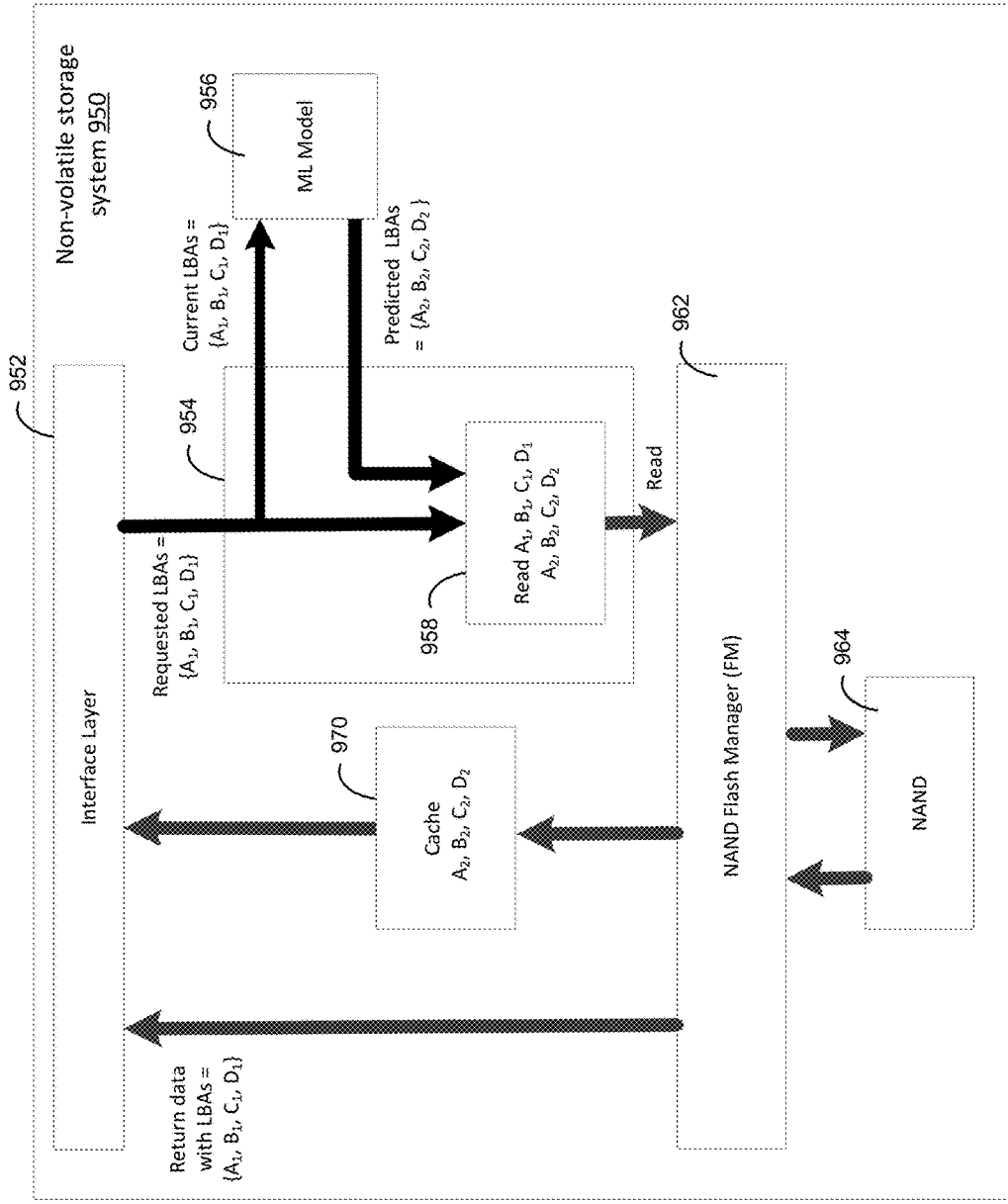
FIG. 10 shows an example of a non-volatile storage system using a machine learning model for read commands.

FIG. 10 illustrates an example of non-volatile storage system 950 that is configured to read data from a predicted addresses in NAND memory 964 according to predicted read commands. Interface layer 952 receives read commands with LBAs $A_1$, $B_1$, $C_1$, $D_1$. The requested addresses are sent to read scheduler 958 in FTL 954. The requested addresses are also sent to machine learning model 956, which generates predicted write addresses LBAs $A_2$, $B_2$, $C_2$, $D_2$ which are also sent to read scheduler 958. Read commands are scheduled for both the received LBAs $A_1$, $B_1$, $C_1$, $D_1$ and the predicted LBAs $A_2$, $B_2$, $C_2$, $D_2$. These read commands may be scheduled for efficiency, for example, by performing reads in parallel where possible and NAND flash manager 962 accesses corresponding physical addresses in NAND memory 964. The data from these addresses is sent from NAND memory 964 to NAND flash manager 962. The data with LBAs $A_1$, $B_1$, $C_1$, $D_1$ requested by the host are sent to interface layer 952 to be returned to the host. The data with predicted LBAs $A_2$, $B_2$, $C_2$, $D_2$ are sent to read cache 970 where it is stored for subsequent return to the host when corresponding read commands are received. Data may be held in read cache 970 until a corresponding read command is received or the data is displaced by newer data (some prefetched data may not be requested by a host and may be evicted from cache after a period of time). In this example, non-volatile storage system 950 may be considered an example of one or more control circuits in communication with memory cells of NAND memory 964, the one or more control circuits are configured to receive a plurality of non-sequential read commands directed to the set of non-volatile memory cells and predict a predicted read command based on the plurality of non-sequential read commands, the one or more control circuits are configured to access the set of non-volatile memory cells according to the predicted read command.

Figure 11:
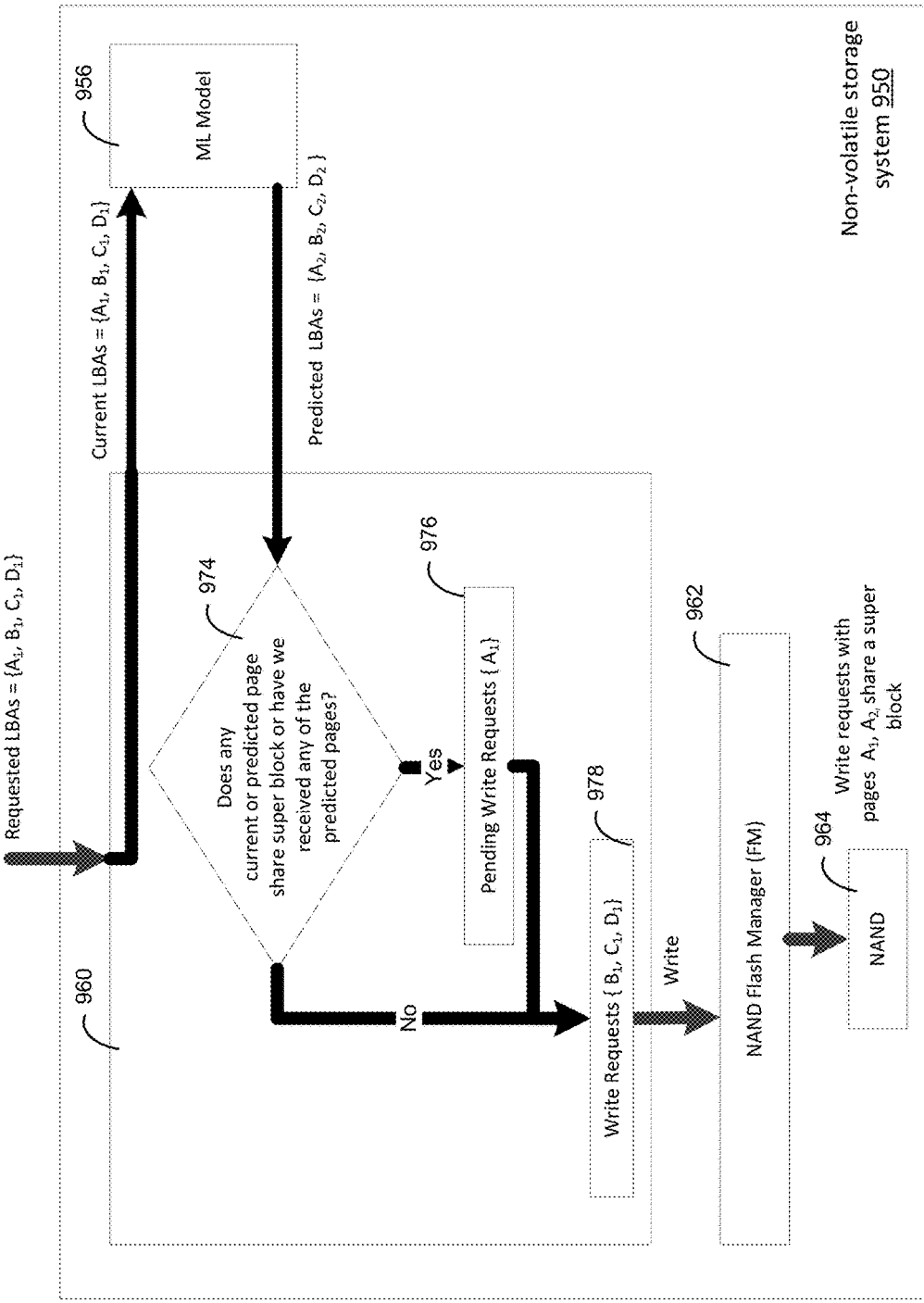
FIG. 11 shows an example of a non-volatile storage system using a machine learning model for write commands.

FIG. 11 shows an example of non-volatile storage system 950 accessing NAND memory 964 according to predicted memory access commands in the case of write commands. Write commands with LBAs $A_1$, $B_1$, $C_1$, $D_1$ are received by non-volatile storage system 950 (e.g. from a host). The identified addresses are sent to write scheduler 960, which sends them to machine learning model 956, which generates predicted write commands with LBAs $A_2$, $B_2$, $C_2$, $D_2$. Predicted LBAs $A_2$, $B_2$, $C_2$, $D_2$ are checked by write scheduler 960 to determine if any current page (page already scheduled for write) or other predicted page (page with predicted LBA $A_2$, $B_2$, $C_2$, $D_2$) share a superblock with the predicted page, and to see whether any of the predicted page has been received 974. If any portion of data (e.g. requested NAND page with LBA $A_1$) shares the same block (or super block) with a predicted portion of data (e.g. NAND page with LBA $A_2$), then the requested portion is held (e.g. NAND page with LBA $A_1$ is held in a separate pending write request queue 976, or write cache, or other buffer, until the predicted command is received with corresponding data with LBA $A_2$). The data corresponding to the requested page and additional data of the predicted page can then be combined for a superblock update (e.g. data corresponding to LBAs $A_1$ and $A_2$ may be combined and used to update a superblock together). Thus, non-volatile storage system 950 may be configured to write the one or more portions of data from received commands and the corresponding data for a predicted command in the set of non-volatile memory cells in parallel after the predicted write command is received with the corresponding data. This helps to reduce fragmentation by keeping logically related pages in the same super block where they get updated together, thereby reducing garbage collection overhead over time. If a requested NAND page does not share the same block (or super block) the write request is sent to write request queue 978. If the predicted write command with corresponding data is not received within a predefined time period then the stored data (e.g. page with $LBAA_1$) is flushed out from pending write request queue 976. In this example, non-volatile storage system 950 may be considered an example of one or more control circuits in communication with non-volatile memory cells of NAND memory 964, the one or more control circuits are configured to receive a plurality of non-sequential write commands directed to the non-volatile memory cells and predict a predicted write command based on the plurality of non-sequential write commands, the one or more control circuits are configured to access the non-volatile memory cells according to the predicted write command.

Figure 12:
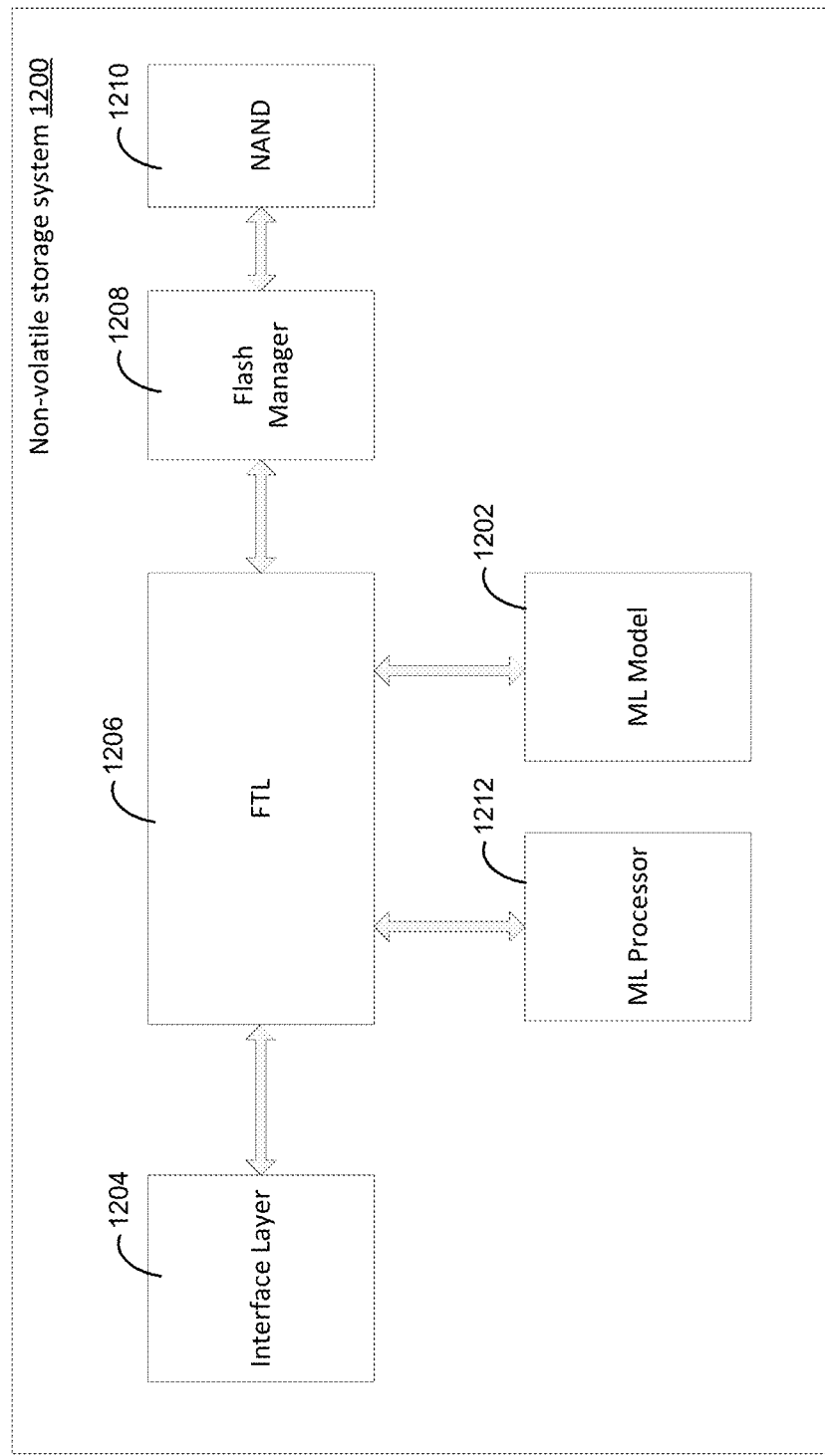
FIG. 12 illustrates an example of a non-volatile storage with a machine learning processor.

In some cases, a machine learning model is generated by a dedicated server, or multiple servers, using logged memory access commands from a non-volatile storage system. In other cases, a machine learning model may be generated within a non-volatile storage system from memory access commands received by the non-volatile storage system. FIG. 12 shows an example of a non-volatile storage system 1200 (e.g. SSD) that is configured to generate a machine learning model 1202 and to update machine learning model 1202 according to memory access commands received. Interface layer 1204 is in communication with a host and with FTL 1206. FTL 1206 communicates with flash manager 1208, which manages accessing NAND flash memory cells of NAND memory 1210. Machine learning processor 1212 is coupled to FTL 1206 so that it can receive memory access commands. In addition, machine learning processor 1212 may receive predicted memory access commands from machine learning model 1202 so that it can compare predicted memory access commands with actual memory access commands. In response to a decline in accuracy of predicted memory access commands, machine learning processor may tune machine learning model (e.g. as shown in FIG. 6) so that the accuracy can be improved as the model adapts to changing patterns of memory access commands (e.g. by modifying coefficients of a machine learning processor). Machine learning processor 1212 may test a current machine learning model for accuracy and may be considered a means for testing the machine learning model to determine accuracy of the machine learning model. In some cases, machine learning model 1202 may initially use coefficients obtained from outside non-volatile storage system 1200 (e.g. default coefficients loaded in an initialization process) while in other examples machine learning processor 1212 may generate coefficients of machine learning model 1202 and may be considered a means for generating a machine learning model to predict memory access commands from a plurality of received memory access commands. Machine learning processor 1212 may be implemented using a processor in a memory controller such as processor 122c of controller 122 of FIG. 2, in which case such a processor may be considered as a means for generating a machine learning model to predict memory access commands from a plurality of received memory access commands and may also be considered as a means for testing the machine learning model to determine accuracy of the machine learning model.

FIG. 13 illustrates an example of a process that includes generating predicted memory access commands from a plurality of non-sequential memory access commands according to a model 1380, comparing the predicted memory access commands from the model with memory access commands received to determine accuracy of the predicted memory access commands according to the model 1382, and in response to determining that accuracy of the predicted memory access commands according to the model is above a threshold, accessing a non-volatile memory according to predictions of the model 1384.

An example of an apparatus includes a set of non-volatile memory cells and one or more control circuits in communication with the set of non-volatile memory cells, the one or more control circuits are configured to receive a plurality of non-sequential memory access commands directed to the set of non-volatile memory cells, predict a predicted memory access command based on the plurality of non-sequential memory access commands, and access the set of non-volatile memory cells according to the predicted memory access command.

The plurality of non-sequential memory access commands may include read commands, the predicted memory access command may be a predicted read command directed to a predicted address, and the one or more control circuits may be configured to read data from the predicted address prior to receiving a read command directed to the predicted address. The one or more control circuits may include a read cache configured to maintain the data from the predicted address until the predicted memory access command is received. The plurality of non-sequential memory access commands may include write commands, the predicted memory access command may be a predicted write command directed to a predicted address, and the one or more control circuits may be configured to defer writing one or more portions of data received with the write commands until the predicted write command is received with corresponding data. The one or more control circuits may include a write cache configured to maintain the one or more portions of data received with the write commands until the predicted write command is received with corresponding data, the one or more control circuits may be further configured to write the one or more portions of data and the corresponding data in the set of non-volatile memory cells together after the predicted write command is received with the corresponding data. The set of non-volatile memory cells may form a plurality of blocks, a block may be a unit of erase, the plurality of non-sequential memory access commands may include write commands, the predicted memory access command may be a predicted write command directed to a predicted address, and the one or more control circuits may be configured to maintain an open location to write data with the predicted address in a block of the plurality of blocks, the block containing data that is logically associated with the predicted address. The block may be an open block containing data with addresses that are sequential with the predicted address. The one or more control circuits may be configured to maintain a plurality of open blocks, each open block containing data that is logically associated with one or more predicted addresses. The one or more control circuits may be configured to predict the predicted memory access command based on the plurality of non-sequential memory access commands according to a model obtained from a training set of non-sequential memory access commands. The model may be obtained through multiple regression cycles comparing predicted memory access commands with received memory access commands for one or more test sets of non-sequential memory access commands. The set of non-volatile memory cells may be monolithically formed in one or more physical levels of arrays of memory cells having an active area disposed above a silicon substrate. The set of non-volatile memory cells may be arranged in NAND strings that extend vertically through the one or more physical levels of arrays of memory cells.

An example of a method includes generating predicted memory access commands from a plurality of non-sequential memory access commands according to a model; comparing the predicted memory access commands from the model with memory access commands received to determine accuracy of the predicted memory access commands according to the model; and in response to determining that accuracy of the predicted memory access commands according to the model is above a threshold, accessing a non-volatile memory according to predictions of the model.

The method may further include, in response to determining that accuracy of the predicted memory access commands according to the model is below a threshold, modifying the model and repeating the generating and the comparing to determine accuracy of predicted memory access commands according to the model as modified. The method may further include repeating the modifying, the generating, and the comparing, in a number of iterations to improve the model. The method may further include, in response to determining that accuracy of the predicted memory access commands according to the model is below a threshold after a predetermined number of iterations, accessing the non-volatile memory without using the model. Accessing the non-volatile memory according to predictions of the model may include prefetching data from the non-volatile memory according to predicted read commands predicted by the model. Accessing the non-volatile memory according to predictions of the model may include deferring writing of portions of received data to the non-volatile memory according to predicted write commands predicted by the model so that the portions of received data can be written in parallel with additional data received with the predicted write commands predicted by the model.

An example of an apparatus includes a set of non-volatile memory cells; means for generating predicted read and write commands for the set of non-volatile memory cells from a plurality of non-sequentially received read and write commands; and means for accessing the set of non-volatile memory cells according to the predicted read and write commands prior to receiving the predicted read and write commands.

The apparatus may also include means for generating a machine learning model to predict memory access commands from a plurality of received memory access commands; and means for testing the machine learning model to determine accuracy of the machine learning model.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
a set of non-volatile memory cells; and
one or more control circuits in communication with the set of non-volatile memory cells, the one or more control circuits are configured to receive a plurality of non-sequential memory access commands directed to the set of non-volatile memory cells and predict a memory access command based on the plurality of non-sequential memory access commands according to a model obtained from a training set of non-sequential memory access commands, the one or more control circuits are configured to access the set of non-volatile memory cells according to the memory access command.

2. The apparatus of claim 1 wherein the plurality of non-sequential memory access commands include read commands, the memory access command is a read command directed to a predicted address, and the one or more control circuits are configured to read data from the predicted address prior to receiving a read command directed to the predicted address.

3. The apparatus of claim 2 wherein the one or more control circuits include a read cache configured to maintain the data from the predicted address until the memory access command is received.

4. The apparatus of claim 1 wherein the plurality of non-sequential memory access commands include write commands, the memory access command is a write command directed to a predicted address, and the one or more control circuits are configured to defer writing one or more portions of data received with the write commands until the write command is received with corresponding data.

5. The apparatus of claim 4 wherein the one or more control circuits include a write cache configured to maintain the one or more portions of data received with the write commands until the write command is received with corresponding data, the one or more control circuits are further configured to write the one or more portions of data and the corresponding data in the set of non-volatile memory cells together after the write command is received with the corresponding data.

6. The apparatus of claim 1 wherein the set of non-volatile memory cells form a plurality of blocks, a block is a unit of erase, the plurality of non-sequential memory access commands include write commands, the memory access command is a write command directed to a predicted address, and the one or more control circuits are configured to maintain an open location to write data with the predicted address in a block of the plurality of blocks, the block containing data that is logically associated with the predicted address.

7. The apparatus of claim 6 wherein the block is an open block containing data with addresses that are sequential with the predicted address.

8. The apparatus of claim 7 wherein the one or more control circuits are configured to maintain a plurality of open blocks, each open block containing data that is logically associated with one or more predicted addresses.

9. The apparatus of claim 1 wherein the one or more control circuits are configured to record the plurality of memory access commands and update the model according to the plurality of memory access commands.

10. The apparatus of claim 1 wherein the model is obtained through multiple regression cycles comparing predicted memory access commands with received memory access commands for one or more test sets of non-sequential memory access commands.

11. The apparatus of claim 1 wherein the set of non-volatile memory cells are monolithically formed in one or more physical levels of arrays of memory cells having an active area disposed above a silicon substrate.

12. The apparatus of claim 11 wherein the set of non-volatile memory cells are arranged in NAND strings that extend vertically through the one or more physical levels of arrays of memory cells.

13. A method, comprising:
generating predicted memory access commands from a plurality of non-sequential memory access commands according to a model;
comparing the predicted memory access commands from the model with memory access commands received to determine accuracy of the predicted memory access commands according to the model; and
in response to determining that accuracy of the predicted memory access commands according to the model is above a threshold, accessing a non-volatile memory according to predictions of the model.

14. The method of claim 13 further comprising, in response to determining that accuracy of the predicted memory access commands according to the model is below a threshold, modifying the model and repeating the generating and the comparing to determine accuracy of predicted memory access commands according to the model as modified.

15. The method of claim 14 further comprising repeating the modifying, the generating, and the comparing, in a number of iterations to improve the model.

16. The method of claim 15 further comprising, in response to determining that accuracy of the predicted memory access commands according to the model is below a threshold after a predetermined number of iterations, accessing the non-volatile memory without using the model.

17. The method of claim 13 wherein accessing the non-volatile memory according to predictions of the model includes prefetching data from the non-volatile memory according to predicted read commands predicted by the model.

18. The method of claim 13 wherein accessing the non-volatile memory according to predictions of the model includes deferring writing of portions of received data to the non-volatile memory according to predicted write commands predicted by the model so that the portions of received data can be written in together with additional data received with the predicted write commands predicted by the model.

19. An apparatus, comprising:
a set of non-volatile memory cells;
means for generating a machine learning model to predict memory access commands from a plurality of received memory access commands;
means for generating predicted read and write commands for the set of non-volatile memory cells from a plurality of non-sequentially received read and write commands according to the machine learning model; and
means for accessing the set of non-volatile memory cells according to the predicted read and write commands prior to receiving the predicted read and write commands.

20. The apparatus of claim 19 further comprising:
means for testing the machine learning model to determine accuracy of the machine learning model.

* * * * *